United States Patent

Kanaboshi et al.

[11] Patent Number: 6,018,211
[45] Date of Patent: *Jan. 25, 2000

[54] SURFACE ACOUSTIC WAVE DEVICE AND METHOD OF MANUFACTURING THE SAME

[75] Inventors: Akihiro Kanaboshi, Neyagawa; Masato Sugimoto, Kadoma; Yutaka Taguchi, Settsu; Kazuo Eda, Nara, all of Japan

[73] Assignee: Matsushita Electric Industrial Co., Ltd., Kadoma, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/921,499

[22] Filed: Sep. 2, 1997

Related U.S. Application Data

[63] Continuation of application No. 08/603,097, Feb. 20, 1996, which is a continuation of application No. 08/420,705, Apr. 11, 1995, abandoned, which is a continuation of application No. 08/229,440, Apr. 12, 1994, abandoned.

[30] Foreign Application Priority Data

| Apr. 28, 1993 | [JP] | Japan | 5-102312 |
| Apr. 28, 1993 | [JP] | Japan | 5-102313 |
| Jun. 3, 1993 | [JP] | Japan | 5-133139 |
| Aug. 26, 1993 | [JP] | Japan | 5-211235 |

[51] Int. Cl.$^7$ .................................. H01L 41/08
[52] U.S. Cl. .................. 310/313 R; 310/344; 310/346
[58] Field of Search ............... 310/313 R, 344, 310/346, 348, 313 A, 26, 27; 333/151, 194

[56] References Cited

U.S. PATENT DOCUMENTS

| 3,781,721 | 12/1973 | Judd et al. ................. 310/313 R X |
| 3,887,887 | 6/1975 | Wagers et al. ............. 310/313 R X |
| 3,914,836 | 10/1975 | Hafner et al. ............... 29/25.35 |
| 3,952,268 | 4/1976 | Schulz et al. ............... 310/313 R X |
| 3,983,514 | 9/1976 | Coussot ....................... 310/313 R X |
| 4,012,650 | 3/1977 | Pratt et al. .................. 310/326 X |
| 4,051,448 | 9/1977 | Coussot ....................... 310/313 R X |
| 4,213,104 | 7/1980 | Cullen et al. ............... 333/150 |
| 4,270,105 | 5/1981 | Parker et al. ............... 310/340 X |
| 4,295,102 | 10/1981 | Schmidt et al. ............ 310/313 R X |
| 4,296,347 | 10/1981 | Welrauch .................... 310/344 X |
| 4,388,600 | 6/1983 | Wakino et al. ............. 310/313 R X |
| 4,639,631 | 1/1987 | Chason et al. .............. 310/344 |
| 4,736,128 | 4/1988 | Takoshima et al. ........ 310/313 R |
| 4,933,588 | 6/1990 | Greer ........................... 310/313 R X |
| 5,059,848 | 10/1991 | Mariani ....................... 310/313 R |
| 5,095,240 | 3/1992 | Nysen et al. ................ 310/313 R |
| 5,192,295 | 3/1993 | Danforth et al. ........... 606/194 |
| 5,218,373 | 6/1993 | Heckaman et al. ......... 343/786 |
| 5,237,235 | 8/1993 | Cho et al. .................... 310/313 R |
| 5,319,324 | 6/1994 | Satoh et al. ................. 310/315 X |
| 5,337,026 | 8/1994 | Borchelt et al. ............ 310/313 R |
| 5,446,330 | 8/1995 | Eda et al. ..................... 310/313 R |
| 5,448,126 | 9/1995 | Eda et al. ..................... 310/313 R X |
| 5,453,652 | 9/1995 | Eda et al. ..................... 310/344 X |

FOREIGN PATENT DOCUMENTS

| 0 531 985 | 3/1993 | European Pat. Off. . |
| 0 602 666 | 6/1994 | European Pat. Off. . |
| 0 608 827 | 8/1994 | European Pat. Off. . |
| 63 070 728 U | 5/1988 | Japan . |
| 63-70728 | 5/1988 | Japan . |
| 1-97006 | 4/1989 | Japan . |
| 1-233821 | 9/1989 | Japan ........................... 310/313 R |
| 5-082404 | 8/1993 | Japan . |
| 5-199056 | 11/1993 | Japan . |
| 2202989 | 10/1988 | United Kingdom ........ 310/344 |

Primary Examiner—Mark O. Budd
Attorney, Agent, or Firm—Morrison & Foerster, LLP

[57] ABSTRACT

A surface acoustic wave device is manufactured by directly or indirectly bonding a lid to a substrate having a surface acoustic wave element to seal the element under the lid. The lid is made of at least one material selected from the group comprising lithium niobate, lithium tantalete, lithium borate, glass and quartz. The substrate is made of at least one material selected from the group comprising quartz, lithium niobate, lithium tantalete and lithium borate.

7 Claims, 23 Drawing Sheets

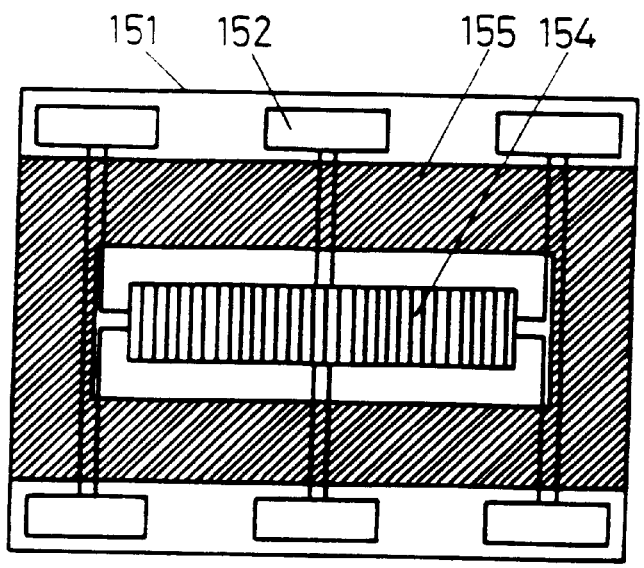
F I G. 1 5 (a)
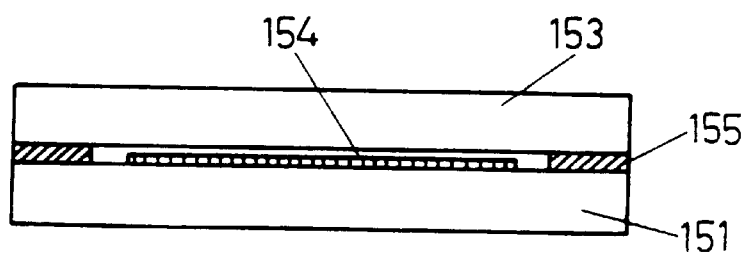
F I G. 1 5 (b)
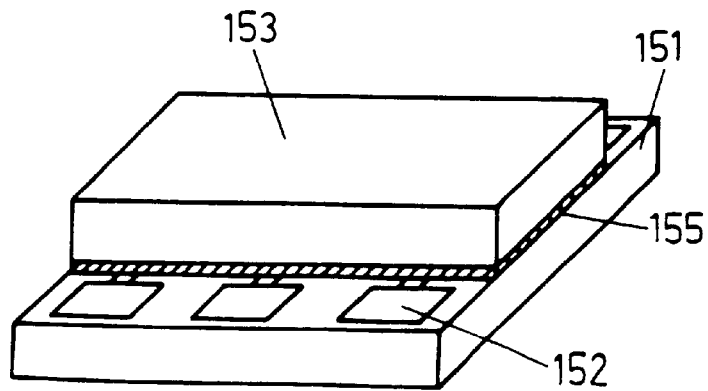
F I G. 1 5 (c)

SURFACE ACOUSTIC WAVE DEVICE AND METHOD OF MANUFACTURING THE SAME

This application is a continuation of application Ser. No. 08/603,097, filed Feb. 20, 1996, which is a continuation of application Ser. No. 08/420,705 filed Apr. 11, 1995, which is a continuation of application Ser. No. 08/229,440 filed Apr. 12. 1994, all now abandoned.

FIELD OF THE INVENTION

The invention relates to a heat and weather resistant and miniaturized surface acoustic wave device, and a method of manufacturing the same. More particularly, the invention relates to a surface acoustic wave device used for a filter, which passes only electric information at a particular frequency, and the like.

BACKGROUND OF THE INVENTION

Along with the recent development of mobile communication equipment, the miniaturization of a surface acoustic wave device has been requested. A surface acoustic wave element in the device is an element for converting electric information to mechanical information and then converting only necessary surface information to electric information.

A conventional surface acoustic wave device is manufactured as follows:

preparing a substrate, which has an inter digital transducer (IDT) for input-output and pads used for leading electrodes on the surface;

placing and gluing the substrate to a metal or ceramic case;

wire bonding the lead electrodes; and covering the case with a metal or ceramic lid.

More specifically, the conventional surface acoustic wave device is shown in FIGS. 22(a), 22(b) and 22(c). In these FIGS., 221 indicates a substrate; 222 is an IDT; 223 is a pad; 224 indicates a ceramic case; 225 shows an input-output terminal; 226 is a ground terminal; 227 indicates a bonding wire; 228 is an adhesive; and 229 indicates a lid.

In this conventional surface acoustic wave device, however, the wall of the case is required to be thick enough to glue the lid on sufficiently. As a result, even if the size of the substrate is small, the size of the device as a whole cannot be miniaturized. For example, a small ceramic package of a conventional surface acoustic wave device is 5 mm wide×5 mm long×1.2 mm thick. In other words, it has been difficult to miniaturize a surface acoustic wave device.

Moreover, the quality of the adhesive which is used to fix the substrate and glue the lid to the case is changed with heat, and the vapor of the adhesive is generated at high temperature such as by soldering or the like. This produces negative effects on the frequency characteristics of the wave filter, and the long-term stability of the surface acoustic wave device is lowered.

In order to solve the problems of conventional surface acoustic wave devices, Published Unexamined Japanese Patent Application Hei 1-97006, for instance, discloses a surface acoustic wave device comprising a glass container. By using a glass container instead of a ceramic or metal case, an adhesive is not required to glue a lid, thus lessening the negative effects of the adhesive on the device. However, an adhesive is still required to glue the substrate to the glass container. In other words, the conventional problems are not completely solved by this surface acoustic wave device.

In addition, Published Unexamined Japanese Utility Model Sho 63-70728 discloses a method of bonding a lid directly on a substrate. However, in this method, an adhesive is used to glue the lid to the circumference of the substrate, and the width of the circumference is required to be wide enough to sufficiently glue the lid. As a result, the miniaturization of the device is still difficult, and the vapor generated from the adhesive provides negative effects on the device.

SUMMARY OF THE INVENTION

An object of the invention is to provide a surface acoustic wave device, which can be easily miniaturized and has stability against heat generated by soldering or the like.

In order to accomplish these and other objects and advantages, the surface acoustic wave device of the invention comprises a substrate having a surface acoustic wave element, and a lid.

The substrate and the lid are bonded to each other by an inorganic covalent bond, which is formed from the same material as the substrate and the lid, thus sealing the surface wave acoustic wave element in an airtight condition by the lid.

For example, if quartz is used for the substrate and the lid, the inorganic covalent bond is expressed as —Si—O—Si—.

It is preferable that the gap between the substrate and the lid is filled with silicon or a silicon compound.

It is also preferable that the substrate is at least one material selected from the group consisting of quartz, lithium niobate, lithium tantalete and lithium borate.

It is further preferable that the silicon compound is silicon oxide or silicon nitride.

It is preferable that the coefficient of thermal expansion of the lid is substantially the same as the coefficient of thermal expansion of the substrate.

It is preferable that a metal film is formed on one of the surface of the lid and the back side of the substrate.

It is also preferable that the lid is made of at least one material selected from the group consisting of quartz, glass, lithium niobate, lithium tantalete and lithium borate.

It is further preferable that the gaps between lead electrodes of the surface acoustic wave element and the lid are filled with a glass having a low boiling point.

The lead electrodes electrically connect terminals where signals are input and output from the surface acoustic wave device.

The surface acoustic wave device of the invention is manufactured by fixing the surface of the lid made of at least one material selected from the group consisting of lithium niobate, lithium tantalete, lithium borate, glass and quartz, to the substrate in the following method (A) or (B), thus substantially sealing the surface acoustic wave element by the lid:

(A) method of cleaning the surfaces of the substrate and the lid, and adding voltage to interfaces between the lid and the substrate, thus bonding the lid to the substrate by anodic bonding; and (B) method of cleaning the surfaces of the substrate and the lid, treating the surfaces of the substrate and the lid to become hydrophilic, contacting the treated surfaces, and treating the contacted surfaces with heat, thus directly bonding the lid to the substrate.

It is preferable in this method that the surface of lid is made of silicon or a silicon compound.

It is also preferable in this method that the surface of the substrate is made of silicon or a silicon compound.

It is further preferable in this method that the back side of the substrate is roughened.

It is preferable in this method that the gaps between the lead electrodes and the lid are filled with a glass having a low melting point.

It is preferable in this method that the substrate and the lid are heated while voltage is applied to the interfaces, thus bonding the lid anodically to the substrate.

It is also preferable in this method that the temperature of heating the substrate and the lid is higher than 100° C., and more preferably higher than 200° C.

BRIEF DESCRIPTION OF THE DRAWINGS

FIG. 15(a) shows a horizontal sectional view of a substrate having a surface acoustic wave element of another embodiment of the invention.

FIG. 15(b) shows a cross sectional view of the surface acoustic wave device comprising the surface acoustic wave element of the embodiment of FIG. 15(a).

FIG. 15(c) shows a perspective view of the surface acoustic wave device of the embodiment of FIG. 15(a).

DETAILED DESCRIPTION OF THE INVENTION

Figure 1:
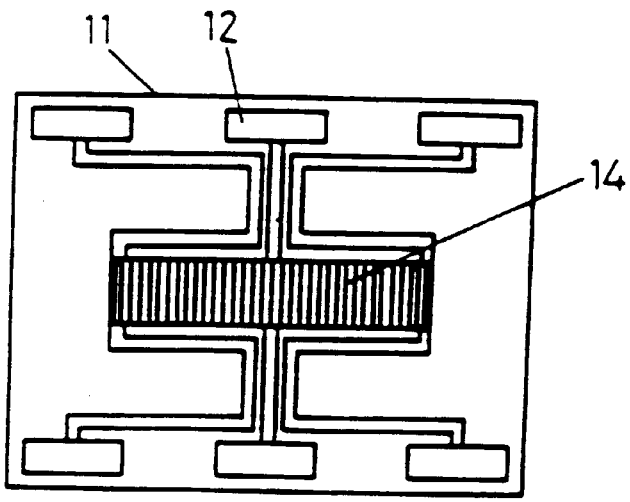
FIG. 1(a) shows a horizontal sectional view of a substrate having a surface acoustic wave element of one embodiment of the invention.
FIG. 1(b) shows a cross sectional view of the surface acoustic wave device comprising the surface acoustic wave element of the embodiment of FIG. 1(a).
FIG. 1(c) shows a perspective view of the surface acoustic wave device of the embodiment of FIG. 1(a).
Figure 1:
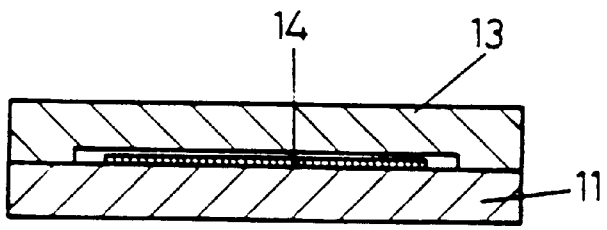
Figure 1:
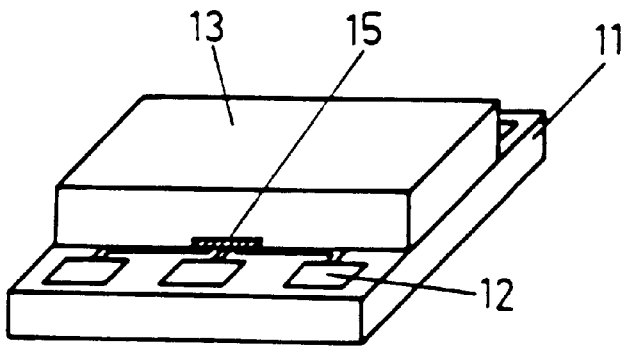

The surface acoustic wave device of the invention comprises a substrate having a surface acoustic wave element, and a lid. The lid and the substrate are bonded together by inorganic covalent bonding to substantially seal in the surface acoustic wave element. Thus, the surface acoustic wave device of the invention can be easily miniaturized. In addition, since an adhesive is not used for the device, the surface acoustic wave device has significant endurance.

The gap between the substrate and the lid is substantially filled with silicon or a silicon compound so that particles around the interfaces between the substrate and the lid are absorbed to the film at the interfaces, thus keeping the interfaces clean. In addition, a glass having a low melting point is not required for the gaps between the lead electrodes and the lid.

If the substrate is made of at least one material selected from the group consisting of quartz, lithium niobate, lithium tantalete and lithium borate, the lid is directly and precisely bonded to the substrate. The surface acoustic wave can also be generated precisely.

The lid is directly and precisely bonded to the substrate if the silicon compound is silicon oxide or silicon nitride.

Since the coefficient of thermal expansion of the lid is substantially the same as the coefficient of thermal expansion of the substrate, the substrate is not cracked or peeled by heat treatment at the direct bonding between the lid and the substrate.

When a metal film is formed on the surface of the lid or the back surface of the substrate, electric noise can be shut from the surface acoustic wave element. Thus, the characteristics of the surface acoustic wave device of the invention remain stable.

The coefficient of thermal expansion of the lid becomes close to the coefficient of the substrate if the lid is made of at least one material selected from the group consisting of quartz, glass, lithium niobate, lithium tantalete and lithium borate. In addition, when the lid is directly bonded to the substrate, the substrate is not cracked or peeled by heat treatment. For instance, if the substrate is made of quartz, the lid can be made of quartz or a glass which has a similar coefficient of thermal expansion to the coefficient of quartz. When the substrate is made of lithium niobate, the lid should be made of lithium niobate or a glass having a similar coefficient of thermal expansion to the coefficient of lithium niobate. Moreover, when the substrate is made of lithium tantalete, the lid should be made of lithium tantalete or a glass having a similar coefficient of thermal expansion to the coefficient of lithium tantalete. If the substrate is made of lithium borate, the lid can be made of lithium borate or a glass with a similar coefficient of thermal expansion to the coefficient of lithium borate.

By filling the gaps between the lid and the lead electrodes with a glass having a low melting point, the gaps are completely sealed off even if no silicon compound is used for the interfaces between the substrate and the lid.

Based on the method of manufacturing the surface acoustic wave device of the invention, the device can be manufactured efficiently.

If the surface of the lid is made of silicon or a silicon compound, the lid and the substrate are directly bonded together efficiently via a silicon compound at the interfaces.

By roughening the back surface of the substrate, a part of the surface acoustic wave generated at the front surface of the substrate is irregularly reflected on the back surface, thus preventing the characteristics of the surface acoustic wave from deteriorating.

By filling the gaps between the lid and the lead electrodes with a glass having a low melting point, the gaps are completely sealed off even if no silicon compound is used for the interfaces between the substrate and the lid.

An anodic bond between the lid and the substrate is easily formed by adding voltage to the interfaces while heating the substrate and the lid. In other words, the voltage can be lowered, and the time spent adding voltage can be shortened.

The strength of directly bonding the lid to the substrate can become sufficiently high if the temperature of heating the lid and the substrate is above 100° C., or preferably higher than 200° C.

The invention is now specifically explained by referring to the following examples. The examples are illustrative and should not be construed as limiting the invention in any way.

EXAMPLE 1

In FIGS. 1($a$), 1($b$) and 1($c$), 11 indicates a substrate; 12 is a lead electrode; 13 shows a lid; 14 is an inter digital transducer (IDT); and 15 indicates a glass having a low melting point. IDT is an electrode generating a surface acoustic wave. Substrate 11 is a ST-cut quartz plate 2.4 mm long×2.8 mm wide×500 μm thick. IDT 14, 0.1 mm long and 1.1 mm wide, was formed on the center of the substrate surface by forming a deposition film of chrome and gold on substrate 11; ground and lead electrodes 12 were also formed around IDT 14 in a similar fashion. A 1.4 mm long×2.8 mm wide×500 μm thick ST-cut quartz plate was used as lid 13. The ST-cut quartz used for lid 13 had the same coefficient of thermal expansion as the ST-cut quartz of substrate 11. Thus, the deterioration of resonance characteristics of the surface acoustic wave element due to the addition of thermal stress to substrate 11 after directly bonding the lid to the substrate was prevented. In addition, the center of lid 13 was etched to form a 0.4 mm long×1.8 mm wide×1 μm deep hole. The sections where the lid and lead electrodes 12 were in contact with each other were also etched about 1 μm deep so that the lid and the electrodes were separated. After cleaning the surfaces of substrate 11 and lid 13, they were directly bonded together. Since the gaps between lid 13 and lead electrodes 12 were filled with a glass of low boiling point 15, IDT 14 on substrate 11 was sealed substantially in an airtight condition by lid 13.

Two methods were applied to directly bond interfaces between a substrate and a lid in this invention.

The first method utilized hydrophilic groups on the surfaces of plates (substrate and lid). For instance, abraded and cleaned silicon plates or quartz plates having hydrophilic groups on the surfaces were contacted together in a clean atmosphere, and then heated, thus strongly bonding them together. The first method was, for example, applied in Example 1. The bond strength of the bonded interfaces was about dozens of kgw/cw² at the contacting step while the strength after the heating treatment step became higher than several hundred kgw/cm². The bond strength is defined herein as the limit value of tensile stress for separating interfaces while adding tensile stress in a direction perpendicular to the interfaces.

More specifically, the interfaces are directly bonded together in the following steps:

bonding the interfaces via hydrogen bonds of the hydrophilic groups (on the surfaces of the plates) and water molecules at the interfaces; and removing the water molecules at the interfaces by heat treatment, thus forming strong covalent bonds among crystal composing atoms.

Figure 23A:
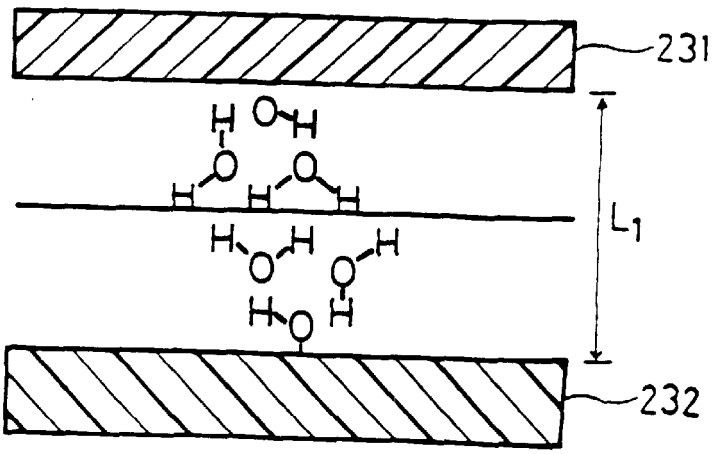
FIG. 23(a) shows a cross sectional view of bonded plates, at a molecular level, of one embodiment of the invention before heat treatment.
Figure 23B:
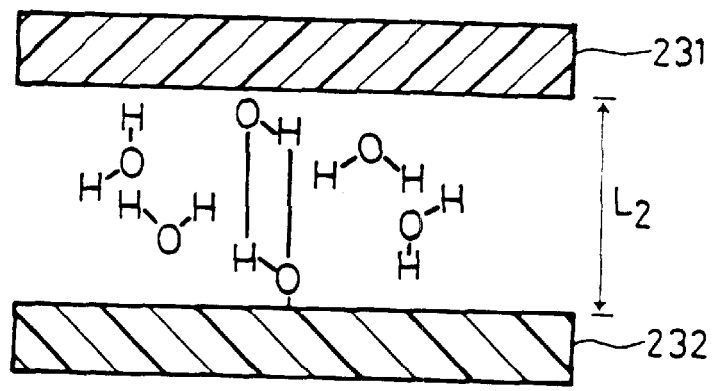
FIG. 23(b) shows a cross sectional view of the bonded plates, at a molecular level, during heat treatment.
Figure 23C:
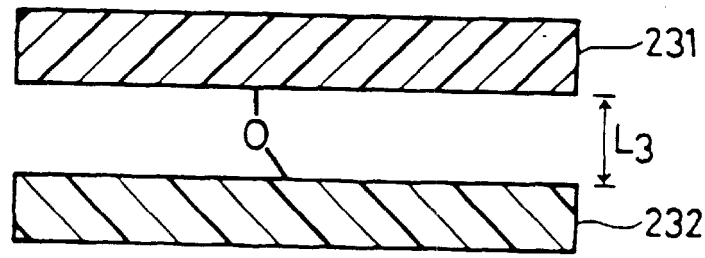
FIG. 23(c) shows a cross sectional view of the bonded plates, at a molecular level, after heat treatment.

As an example, FIGS. 23($a$), 23($b$) and 23($c$) show the steps of directly bonding the interfaces of plates. In these figures, 231 and 232 indicate Si plates. The interfaces of Si plates 231 and 232 were bonded together via hydrogen bonds of the hydrophilic groups (on the surfaces of the Si plates) and water molecules at the interfaces before heat treatment (FIG. 23($a$)). The water molecules at the interfaces were removed by heat treatment, thus forming strong covalent bonds among crystal composing atoms (FIG. 23($c$)). FIG. 23($b$) shows bonding condition between Si plates 231 and 232 after heat treatment at 200° C.; the distance between Si plates 231 and 232 in FIG. 23($a$) ($L_1$=70 nm) became 35 nm ($L_2$) after the treatment. After heating the interfaces higher than 700° C., the water molecules were completely removed from the interfaces (FIG. 23($c$)), and the distance between Si plates 231 and 232 ($L_3$) was then 16 nm.

Since the interfaces are directly bonded to each other at an atomic level in this method, the bond strength is significantly high. The size of the surface acoustic wave device can also be extremely small because extra area is not required to glue the lid to the substrate. Additionally, because an organic adhesive is not used in this method, gas from the adhesive is not generated, and the surface acoustic wave device becomes resistant to heat and vibrations.

The second method comprises the following steps:

directly contacting abraded and cleaned silicon plates or quartz plates; and adding voltage to the plates while heating them, thus bonding them together by an electrostatic attractive force between the plates.

The second method utilizing anodic bonding provided a device having the same properties as the device manufactured by the first method. As in the first method, the bond strength between the interfaces is significantly strong, and the surface acoustic wave device can be extremely miniaturized. In addition, since no adhesive is used in this method, gas from the adhesive is not generated, and the device will be resistant to heat and vibrations.

Even if a glass having a low boiling point is used to fill the gaps between the lead electrodes and the lid in the invention, the surface area of the glass is so small that there is no negative effect on the surface acoustic wave device of the invention.

EXAMPLE 2

Figure 2:
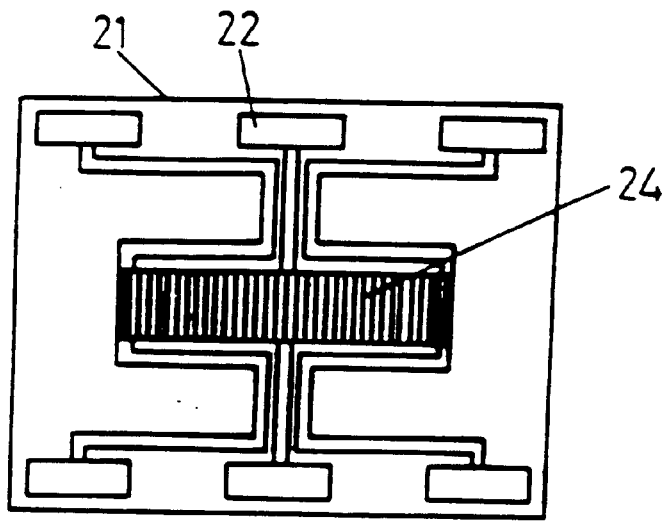
FIG. 2(a) shows a horizontal sectional view of a substrate having a surface acoustic wave element of another embodiment of the invention.
FIG. 2(b) shows a cross sectional view of the surface acoustic wave device comprising the surface acoustic wave element of the embodiment of FIG. 2(a).
FIG. 2(c) shows a perspective view of the surface acoustic wave device of the embodiment of FIG. 2(a).
Figure 2:
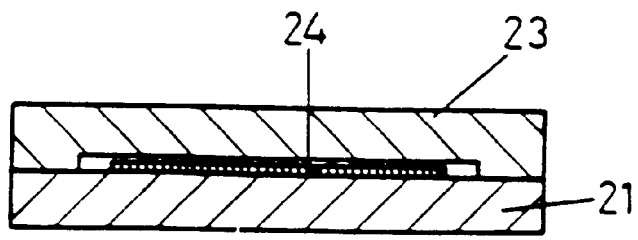
Figure 2:
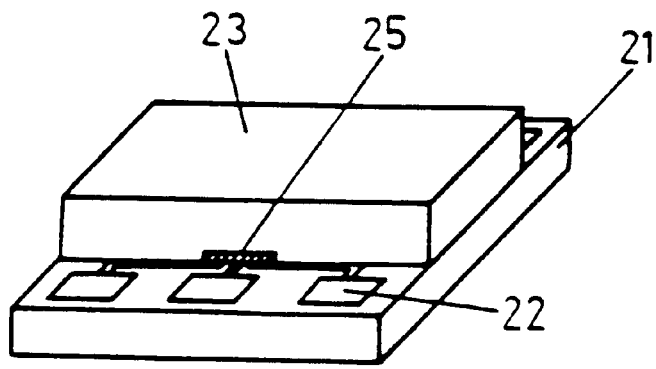
Figure 3:
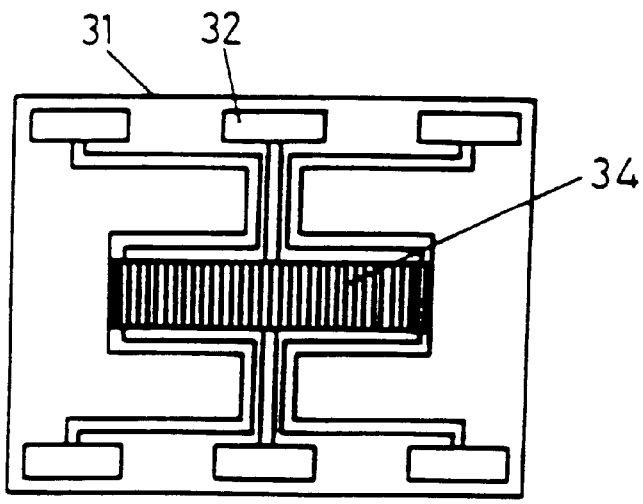
FIG. 3(a) shows a horizontal sectional view of a substrate having a surface acoustic wave element of another embodiment of the invention.
FIG. 3(b) shows a cross sectional view of the surface acoustic wave device comprising the surface acoustic wave element of the embodiment of FIG. 3(a).
FIG. 3(c) shows a perspective view of the surface acoustic wave device of the embodiment of FIG. 3(a).
Figure 3:
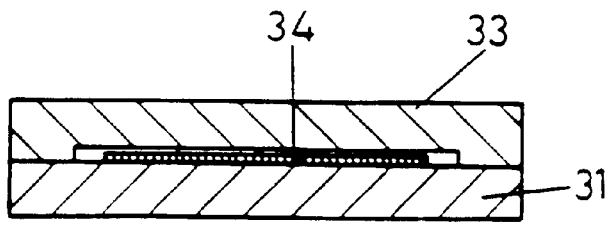
Figure 3:
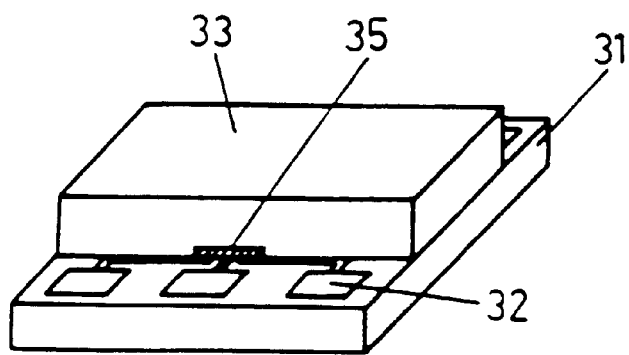
Figure 4:
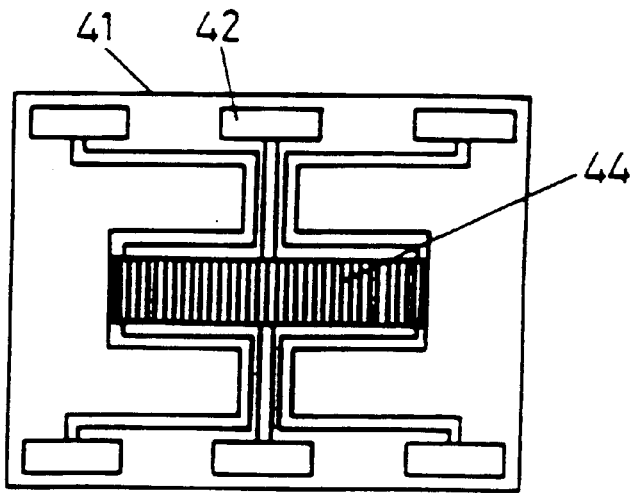
FIG. 4(a) shows a horizontal sectional view of a substrate having a surface acoustic wave element of another embodiment of the invention.
FIG. 4(b) shows a cross sectional view of the surface acoustic wave device comprising the surface acoustic wave element of the embodiment of FIG. 4(a).
FIG. 4(c) shows a perspective view of the surface acoustic wave device of the embodiment of FIG. 4(a).
Figure 4:
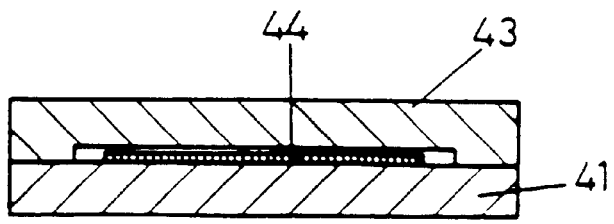
Figure 4:
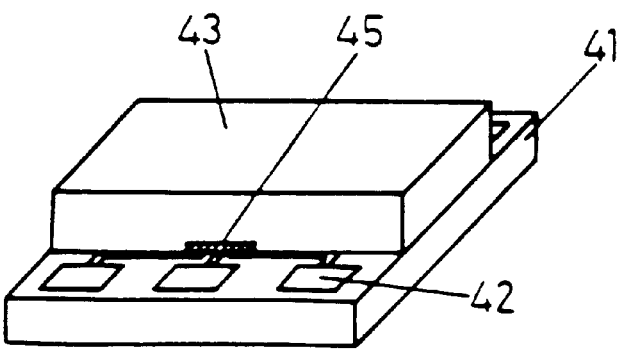
Figure 5:
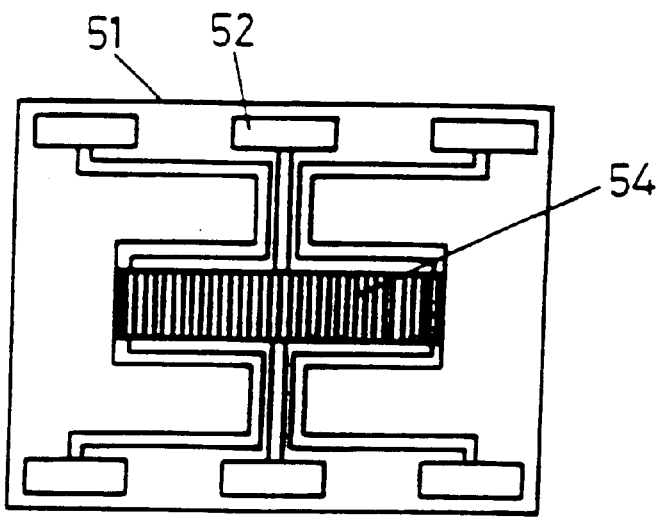
FIG. 5(a) shows a horizontal sectional view of a substrate having a surface acoustic wave element of another embodiment of the invention.
FIG. 5(b) shows a cross sectional view of the surface acoustic wave device comprising the surface acoustic wave element of the embodiment of FIG. 5(a).
FIG. 5(c) shows a perspective view of the surface acoustic wave device of the embodiment of FIG. 5(a).
Figure 5:
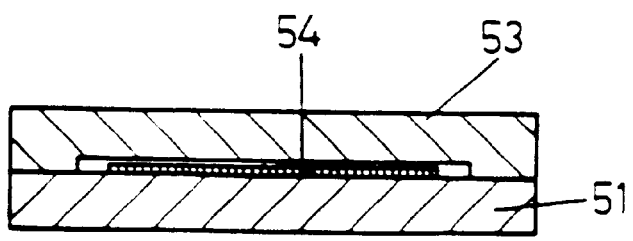
Figure 5:
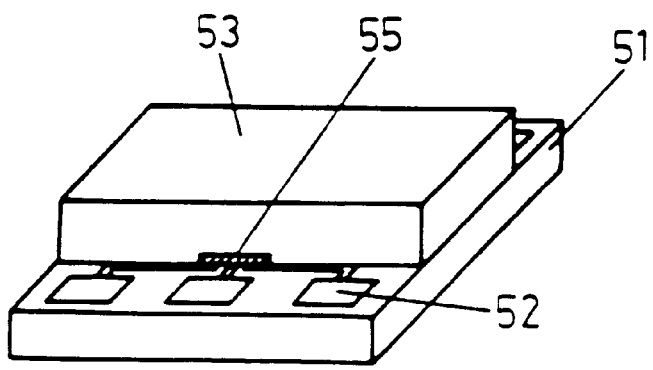
Figure 6:
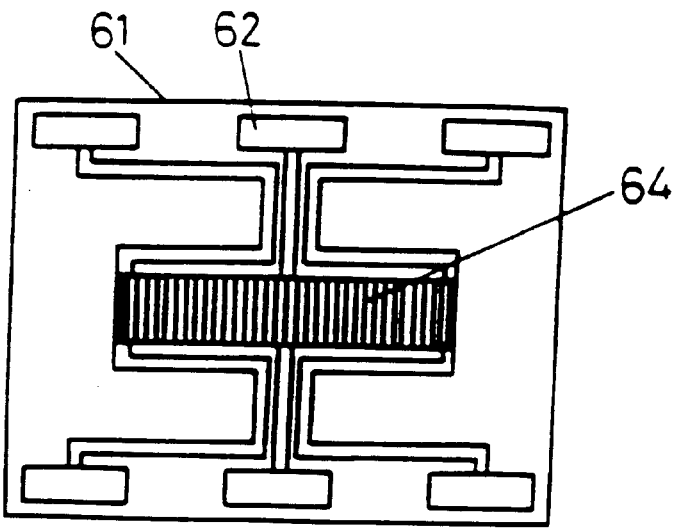
FIG. 6(a) shows a horizontal sectional view of a substrate having a surface acoustic wave element of another embodiment of the invention.
FIG. 6(b) shows a cross sectional view of the surface acoustic wave device comprising the surface acoustic wave element of the embodiment of FIG. 6(a).
FIG. 6(c) shows a perspective view of the surface acoustic wave device of the embodiment of FIG. 6(a).
Figure 6:
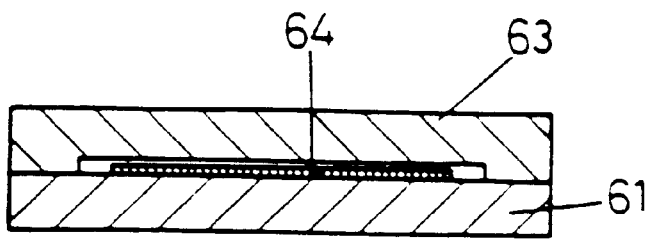
Figure 6:
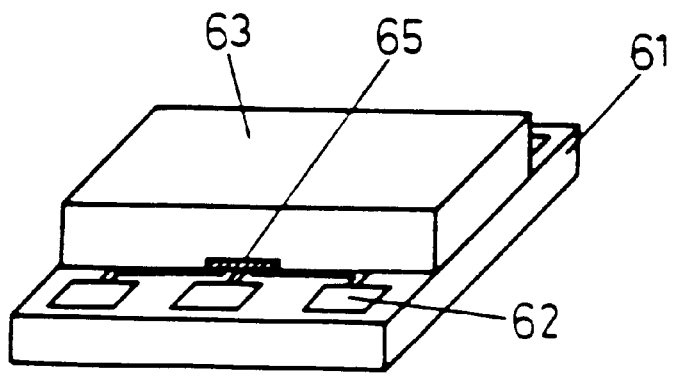
Figure 7:
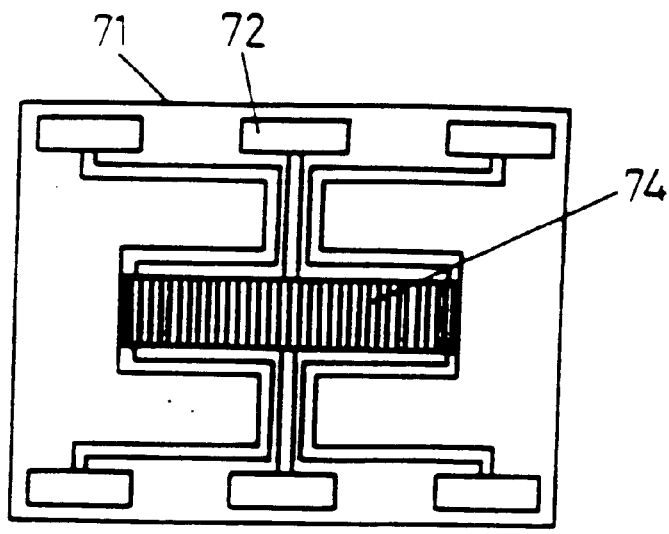
FIG. 7(a) shows a horizontal sectional view of a substrate having a surface acoustic wave element of another embodiment of the invention.
FIG. 7(b) shows a cross sectional view of the surface acoustic wave device comprising the surface acoustic wave element of the embodiment of FIG. 7(a).
FIG. 7(c) shows a perspective view of the surface acoustic wave device of the embodiment of FIG. 7(a).
Figure 7:
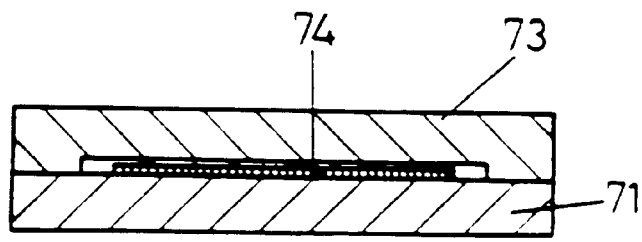
Figure 7:
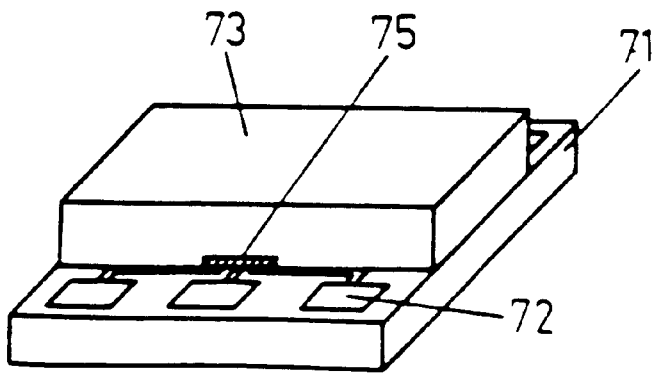
Figure 8:
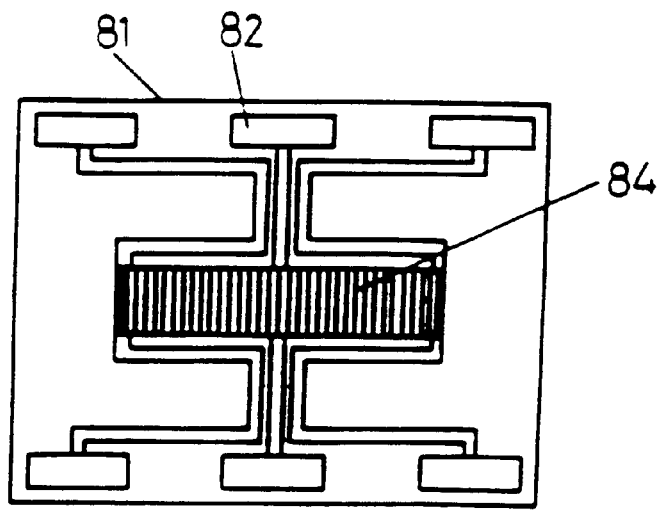
FIG. 8(a) shows a horizontal sectional view of a substrate having a surface acoustic wave element of another embodiment of the invention.
FIG. 8(b) shows a cross sectional view of the surface acoustic wave device comprising the surface acoustic wave element of the embodiment of FIG. 8(a).
FIG. 8(c) shows a perspective view of the surface acoustic wave device of the embodiment of FIG. 8(a).
Figure 8:
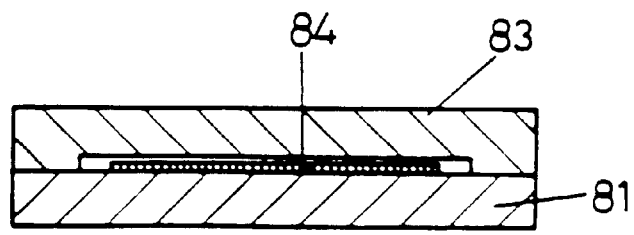
Figure 8:
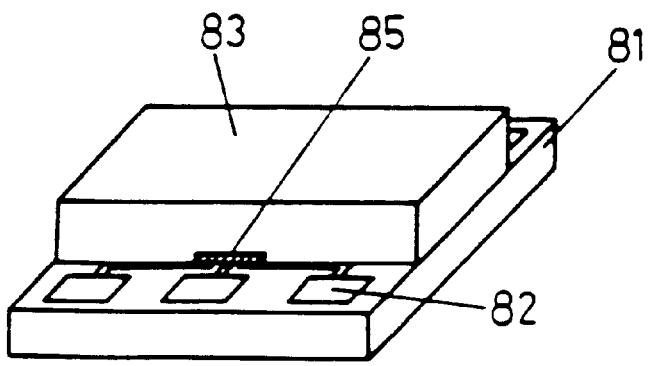
Figure 9:
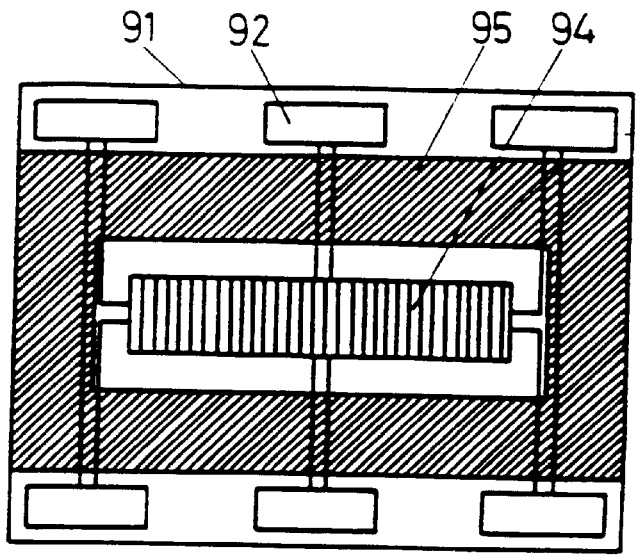
FIG. 9(a) shows a horizontal sectional view of a substrate having a surface acoustic wave element of another embodiment of the invention.
FIG. 9(b) shows a cross sectional view of the surface acoustic wave device comprising the surface acoustic wave element of the embodiment of FIG. 9(a).
FIG. 9(c) shows a perspective view of the surface acoustic wave device of the embodiment of FIG. 9(a).
Figure 9:
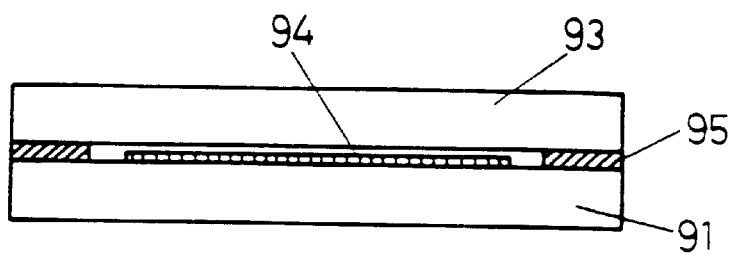
Figure 9:
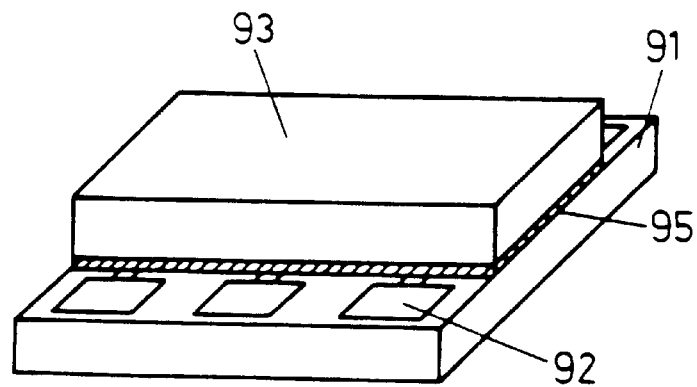
Figure 10A:
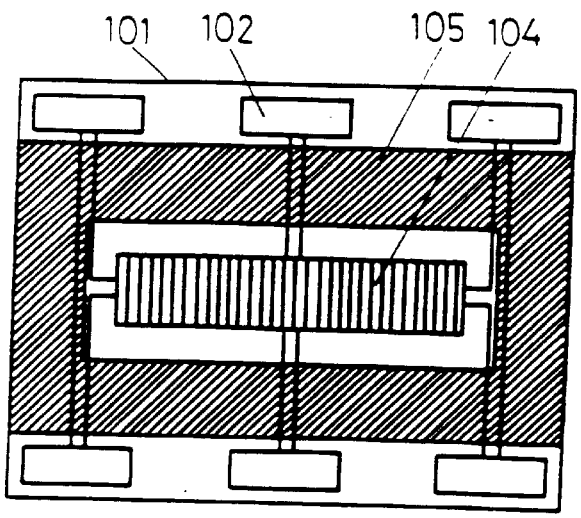
FIG. 10(a) shows a horizontal sectional view of a substrate having a surface acoustic wave element of another embodiment of the invention.
Figure 10B:
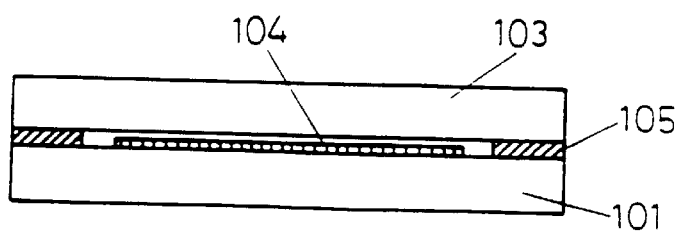
FIG. 10(b) shows a cross sectional view of the surface acoustic wave device comprising the surface acoustic wave element of the embodiment of FIG. 10(a).
Figure 10C:
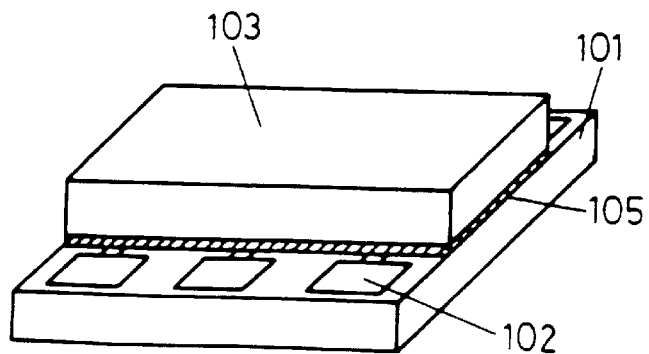
FIG. 10(c) shows a perspective view of the surface acoustic wave device of the embodiment of FIG. 10(a).
Figure 11A:
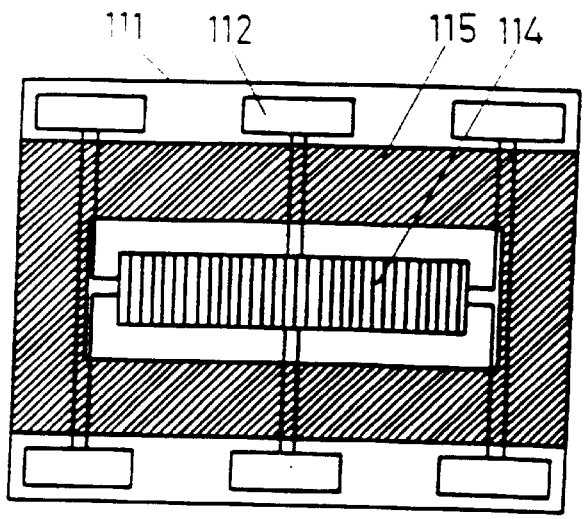
FIG. 11(a) shows a horizontal sectional view of a substrate having a surface acoustic wave element of another embodiment of the invention.
Figure 11B:
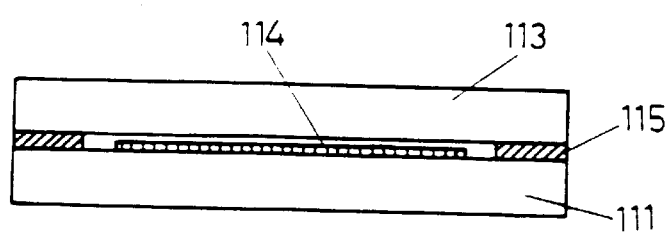
FIG. 11(b) shows a cross sectional view of the surface acoustic wave device comprising the surface acoustic wave element of the embodiment of FIG. 11(a).
Figure 11C:
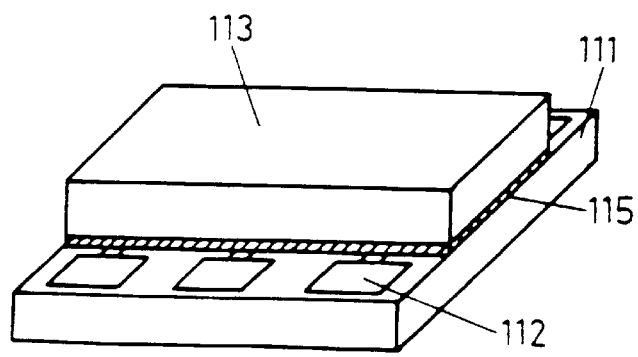
FIG. 11(c) shows a perspective view of the surface acoustic wave device of the embodiment of FIG. 11(a).
Figure 12A:
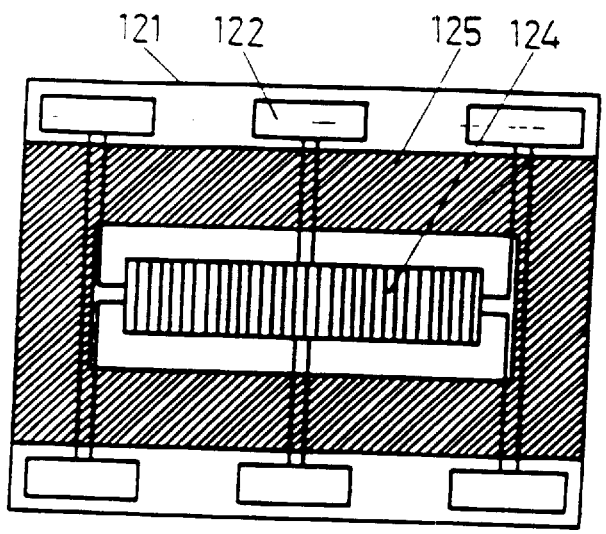
FIG. 12(a) shows a horizontal sectional view of a substrate having a surface acoustic wave element of another embodiment of the invention.
Figure 12B:
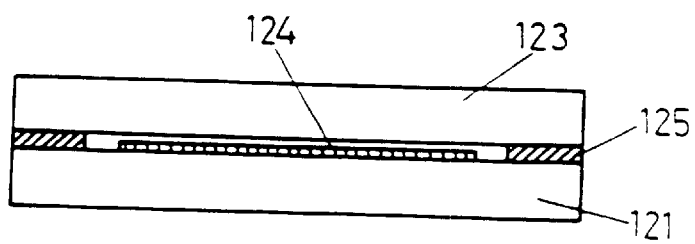
FIG. 12(b) shows a cross sectional view of the surface acoustic wave device comprising the surface acoustic wave element of the embodiment of FIG. 12(a).
Figure 12C:
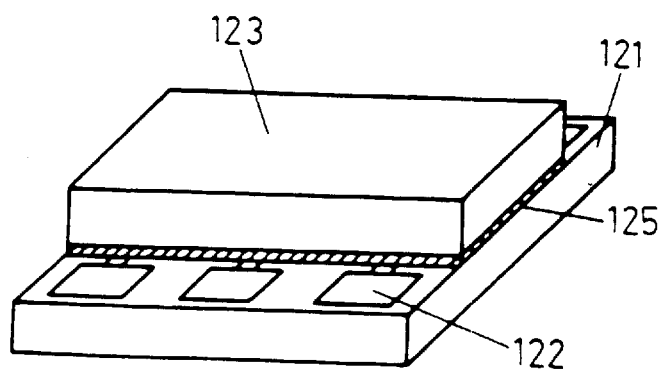
FIG. 12(c) shows a perspective view of the surface acoustic wave device of the embodiment of FIG. 12(a).
Figure 13A:
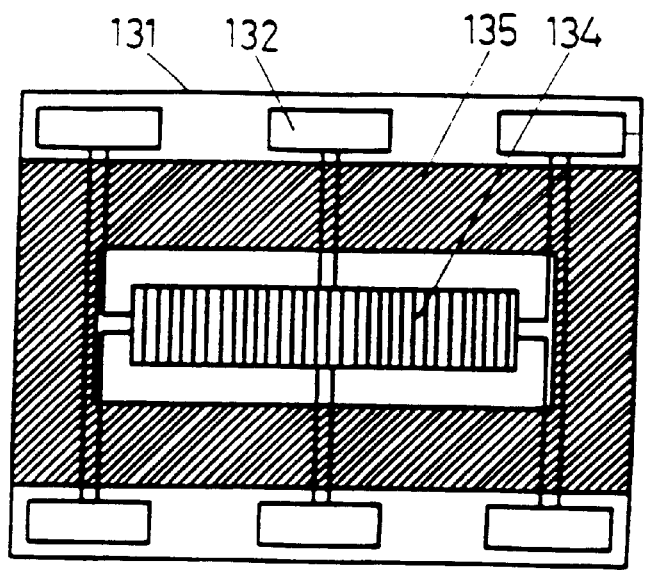
FIG. 13(a) shows a horizontal sectional view of a substrate having a surface acoustic wave element of another embodiment of the invention.
Figure 13B:
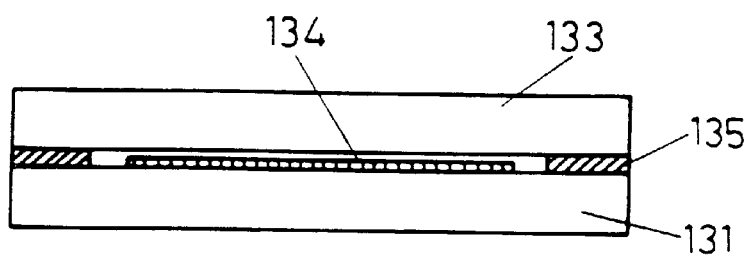
FIG. 13(b) shows a cross sectional view of the surface acoustic wave device comprising the surface acoustic wave element of the embodiment of FIG. 13(a).
Figure 13C:
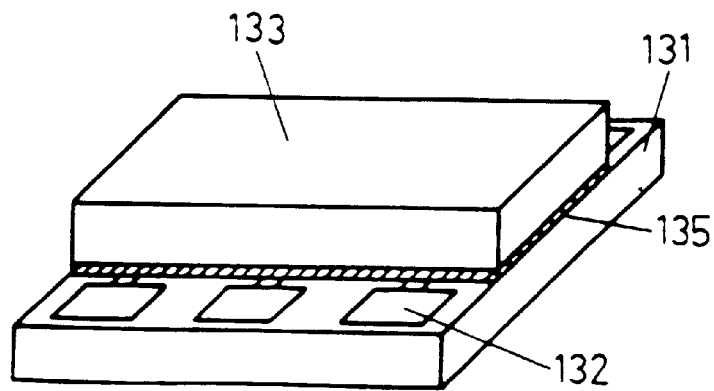
FIG. 13(c) shows a perspective view of the surface acoustic wave device of the embodiment of FIG. 13(a).
Figure 14A:
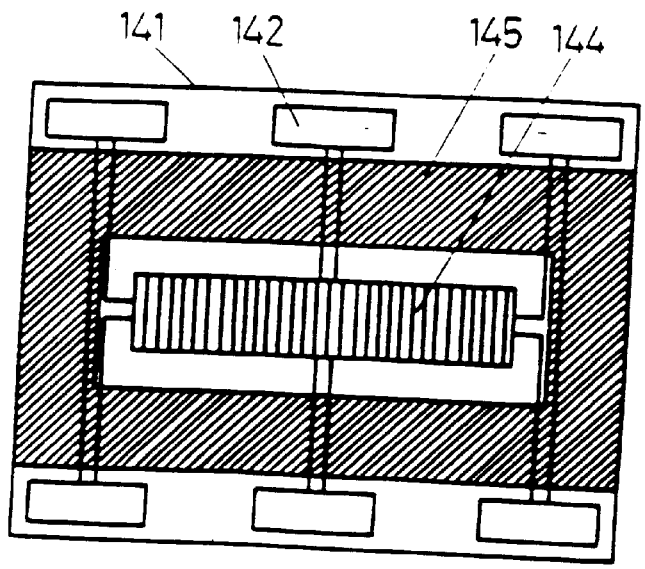
FIG. 14(a) shows a horizontal sectional view of a substrate having a surface acoustic wave element of another embodiment of the invention.
Figure 14B:
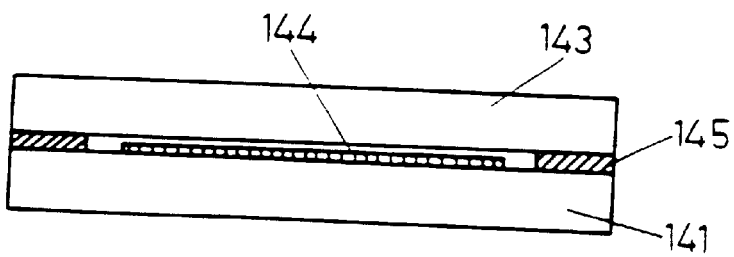
FIG. 14(b) shows a cross sectional view of the surface acoustic wave device comprising the surface acoustic wave element of the embodiment of FIG. 14(a).
Figure 14C:
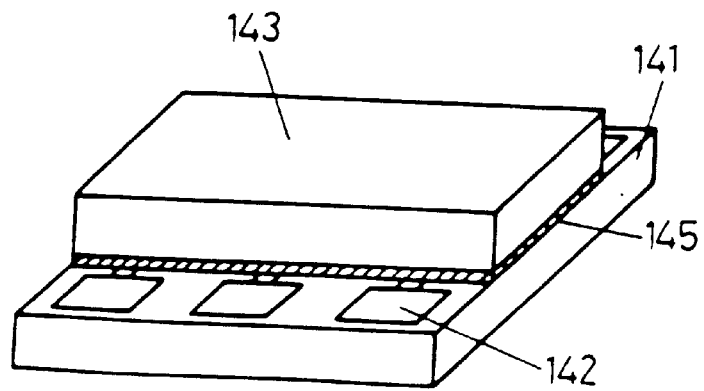
FIG. 14(c) shows a perspective view of the surface acoustic wave device of the embodiment of FIG. 14(a).
Figure 16A:
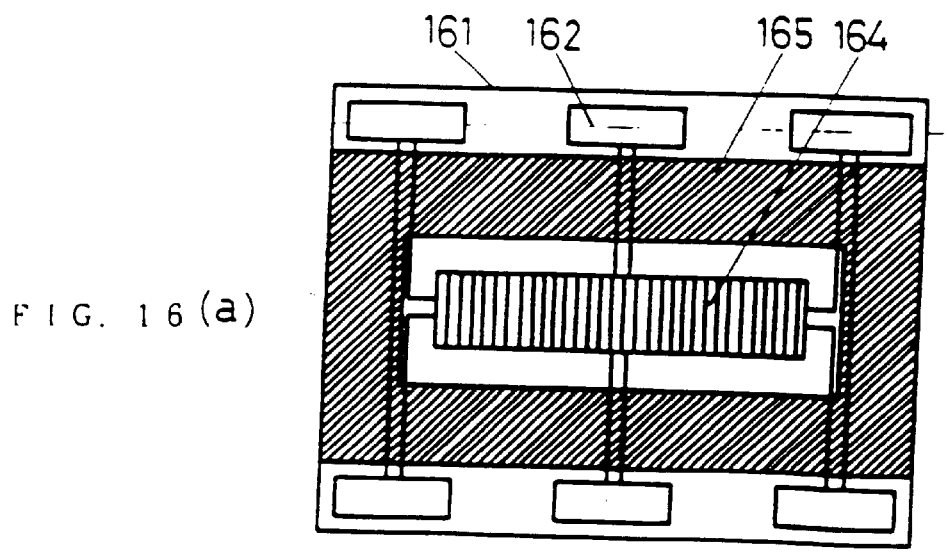
FIG. 16(a) shows a horizontal sectional view of a substrate having a surface acoustic wave element of another embodiment of the invention.
Figure 16B:
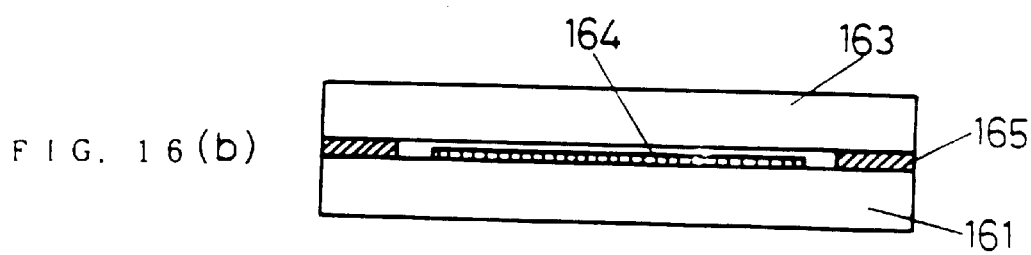
FIG. 16(b) shows a cross sectional view of the surface acoustic wave device comprising the surface acoustic wave element of the embodiment of FIG. 16(a).
Figure 16C:
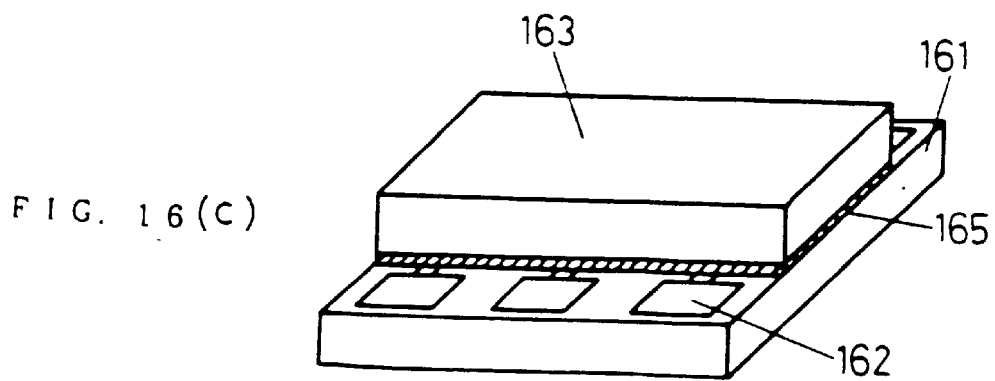
FIG. 16(c) shows a perspective view of the surface acoustic wave device of the embodiment of FIG. 16(a).
Figure 17A:
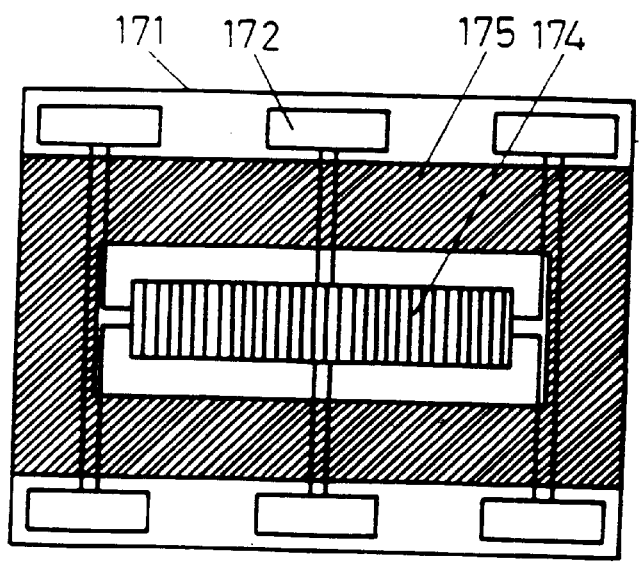
FIG. 17(a) shows a horizontal sectional view of a substrate having a surface acoustic wave element of another embodiment of the invention.
Figure 17B:
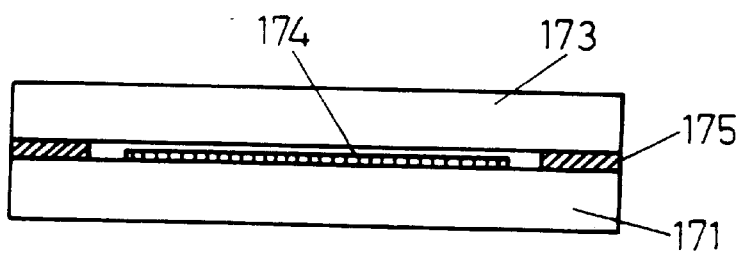
FIG. 17(b) shows a cross sectional view of the surface acoustic wave device comprising the surface acoustic wave element of the embodiment of FIG. 17(a).
Figure 17C:
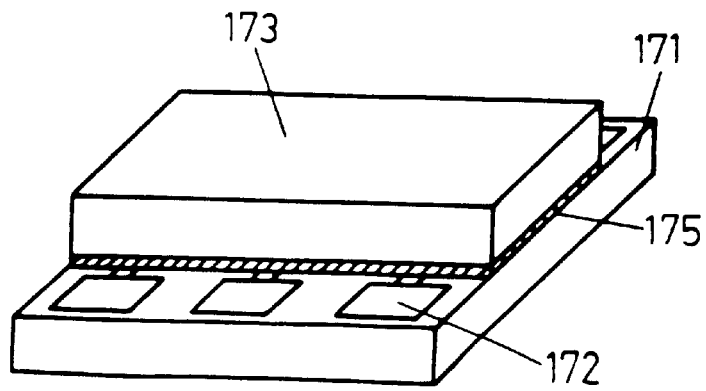
FIG. 17(c) shows a perspective view of the surface acoustic wave device of the embodiment of FIG. 17(a).

In FIGS. 2($a$), 2($b$) and 2($c$), 21 indicates a substrate; 22 is a lead electrode; 23 shows a lid; 24 is an IDT; and 25 indicates a glass having a low melting point. Substrate 21 is a ST-cut quartz plate 2.4 mm long×2.8 mm wide×500 μm thick. IDT 24, 0.1 mm long and 1.1 mm wide, was formed on the center of the substrate surface by forming a deposition film of chrome and gold on substrate 21. Ground and lead electrodes 22 were also formed around IDT 24 in a similar fashion. A 1.4 mm long×2.8 mm wide×500 μm thick glass plate was used as lid 23. The glass plate used for lid 13 had the same coefficient of thermal expansion as the ST-cut quartz of substrate 21. Thus, the deterioration of resonance characteristics of the surface acoustic wave element due to the addition of thermal stress to substrate 21 after directly bonding the lid to the substrate was prevented. In addition, the center of lid 23 was etched to form a 0.4 mm long×1.8 mm wide×1 μm deep hole. The sections where the lid and lead electrodes 22 were in contact with each other were also etched about 1 μm deep so that the lid and the electrode were separated. After cleaning the surfaces of substrate 21 and lid 23, they were directly bonded together. Since the gaps between lid 23 and lead electrodes 22 were filled with a glass having a low boiling point 25, IDT 24 on substrate 21 was sealed substantially in an airtight condition by lid 23.

EXAMPLE 3

In FIGS. 3(a), 3(b) and 3(c), 31 indicates a substrate; 32 is a lead electrode; 33 shows a lid; 34 is an IDT; and 35 indicates a glass having a low melting point. Substrate 31 is a Y-cut lithium niobate 2.4 mm long×2.8 mm wide×500 μm thick. An IDT 34, 0.1 mm long and 1.1 mm wide, was formed on the center of the substrate surface by forming a deposition film of chrome and gold on substrate 31. Ground and lead electrodes 32 were also formed around IDT 34 in a similar fashion. A 1.4 mm long×2.8 mm wide×500 μm thick AT-cut quartz plate was used as lid 33. The AT-cut quartz plate used for lid 33 had the same coefficient of thermal expansion as the Y-cut lithium niobate of substrate 31. Thus, the deterioration of resonance characteristics of the surface acoustic wave element due to the addition of thermal stress to substrate 31 after directly bonding the lid to the substrate was prevented. In addition, the center of lid 33 was etched to form a 0.4 mm long×1.8 mm wide×1 μm deep hole. The sections where the lid and lead electrodes 32 were in contact with each other were also etched for about 1 μm deep so that the lid and the electrodes were separated. After cleaning the surfaces of substrate 31 and lid 33, they were directly bonded together. Since the gaps between lid 33 and lead electrodes 32 were filled with a glass having a low boiling point 35, IDT 34 on substrate 31 was sealed substantially in an airtight condition by lid 33.

EXAMPLE 4

In FIGS. 4(a), 4(b) and 4(c), 41 indicates a substrate; 42 is a lead electrode; 43 shows a lid; 44 is an IDT; and 45 indicates a glass having a low melting point. Substrate 41 is a Y-cut lithium tantalete 2.4 mm long×2.8 mm wide×500 μm thick. IDT 44, 0.1 mm long and 1.1 mm wide, was formed on the center of the substrate surface by forming a deposition film of chrome and gold on substrate 41. Ground and lead electrodes 42 were also formed around IDT 44 in a similar fashion. A 1.4 mm long×2.8 mm wide×500 μm thick AT-cut quartz plate was used as lid 43. The AT-cut quartz plate used for lid 43 had the same coefficient of thermal expansion as the Y-cut lithium tantalete of substrate 41. Thus, the deterioration of resonance characteristics of the surface acoustic wave element due to the addition of thermal stress to substrate 41 after directly bonding the lid to the substrate was prevented. In addition, the center of lid 43 was etched to form a 0.4 mm long×1.8 mm wide×1 μm deep hole. The sections where the lid and lead electrodes 42 were in contact with each other were also etched about 1 μm deep so that the lid and the electrodes were separated. After cleaning the surfaces of substrate 41 and lid 43, they were directly bonded together. Since the gaps between lid 43 and lead electrodes 42 were filled with a glass having a low boiling point 45, IDT 44 on substrate 41 was sealed substantially in an airtight condition by lid 43.

EXAMPLE 5

In FIGS. 5(a), 5(b) and 5(c), 51 indicates a substrate; 52 is a lead electrode; 53 shows a lid; 54 is an IDT; and 55 indicates a glass having a low melting point. Substrate 51 is a Y-cut lithium niobate 2.4 mm long×2.8 mm wide×500 μm thick. IDT 54, 0.1 mm long and 1.1 mm wide, was formed on the center of the substrate surface by forming a deposition film of chrome and gold on substrate 51. Ground and extended electrodes 52 were also formed around IDT 54 in a similar fashion. A 1.4 mm long×2.8 mm wide×500 μm thick lithium niobate was used as lid 53. The lithium niobate used for lid 53 had the same coefficient of thermal expansion as the Y-cut lithium niobate of substrate 51. Thus, the deterioration of resonance characteristics of the surface acoustic wave element due to the addition of thermal stress to substrate 51 after directly bonding the lid to the substrate was prevented. In addition, the center of lid 53 was etched to form a 0.4 mm long×1.8 mm wide×1 μm deep hole. The sections where the lid and lead electrodes 52 were in contact with each other were also etched for about 1 μm deep so that the lid and the electrodes were separated. After cleaning the surfaces of substrate 51 and lid 53, they were directly bonded together. Since the gaps between lid 53 and lead electrodes 52 was filled with a glass having a low boiling point 55, IDT 54 on substrate 51 was sealed substantially in an airtight condition by lid 53.

EXAMPLE 6

In FIGS. 6(a), 6(b) and 6(c), 61 indicates a substrate; 62 is a lead electrode; 63 shows a lid; 64 is an IDT; and 65 indicates a glass having a low melting point. Substrate 61 is a Y-cut lithium tantalete 2.4 mm long×2.8 mm wide×500 μm thick. IDT 64, 0.1 mm long and 1.1 mm wide, was formed on the center of the substrate surface by forming a deposition film of chrome and gold on substrate 61. Ground and extended electrodes 62 were also formed around IDT 64 in a similar fashion. A 1.4 mm long×2.8 mm wide×500 μm thick lithium tantalete was used as lid 63. The lithium tantalete used for lid 63 had the same coefficient of thermal expansion as the Y-cut lithium tantalete of substrate 61. Thus, the deterioration of resonance characteristics of the surface acoustic wave element due to the addition of thermal stress to substrate 61 after directly bonding the lid to the substrate was prevented. In addition, the center of lid 63 was etched to form a 0.4 mm long×1.8 mm wide×1 μm deep hole. The sections where the lid and lead electrodes 62 were in contact with each other were also etched about 1 μm deep so that the lid and the electrodes were separated. After cleaning the surfaces of substrate 61 and lid 63, they were directly bonded together. Since the gaps between lid 63 and lead electrodes 62 were filled with a glass having a low boiling point 65, IDT 64 on substrate 61 was sealed substantially in an airtight condition by lid 63.

EXAMPLE 7

In FIGS. 7(a), 7(b) and 7(c), 71 indicates a substrate; 72 is a lead electrode; 73 shows a lid; 74 is an IDT; and 75 indicates a glass having a low melting point. Substrate 71 is a Y-cut lithium niobate 2.4 mm long×2.8 mm wide×500 μm thick. IDT 74, 0.1 mm long and 1.1 mm wide, was formed on the center of the substrate surface by forming a deposition film of chrome and gold on substrate 71. Ground and extended electrodes 72 were also formed around IDT 74 in a similar fashion. A 1.4 mm long×2.8 mm wide×500 μm thick glass plate was used as lid 73. The glass plate used for lid 73 had the same coefficient of thermal expansion as the Y-cut lithium niobate of substrate 71. Thus, the deterioration of resonance characteristics of the surface acoustic wave element due to the addition of thermal stress to substrate 71 after directly bonding the lid to the substrate was prevented. In addition, the center of lid 73 was etched to form a 0.4 mm long×1.8 mm wide×1 μm deep hole. The sections where the lid and lead electrodes 72 were in contact with each other were also etched about 1 μm deep so that the lid and the electrodes were separated. After cleaning the surfaces of substrate 71 and lid 73, they were directly bonded together. Since the gaps between lid 73 and lead electrodes 72 were filled with a glass having a low boiling point 75, IDT 74 on substrate 71 was sealed substantially in an airtight condition by lid 73.

EXAMPLE 8

In FIGS. 8(a), 8(b) and 8(c), 81 indicates a substrate; 82 is a lead electrode; 83 shows a lid; 84 is an IDT; and 85 indicates a glass having a low melting point. Substrate 81 is a lithium tantalete 2.4 mm long×2.8 mm wide×500 μm thick. IDT 84, 0.1 mm long and 1.1 mm wide, was formed on the center of the substrate surface by forming a deposition film of chrome and gold on substrate 81. Ground and extended electrodes 82 were also formed around IDT 84 in a similar fashion. A 1.4 mm long×2.8 mm wide×500 μm thick glass plate was used as lid 83. The glass plate used for lid 83 had the same coefficient of thermal expansion as the lithium tantalete of substrate 81. Thus, the deterioration of resonance characteristics of the surface acoustic wave element due to the addition of thermal stress to substrate 81 after directly bonding the lid to the substrate was prevented. In addition, the center of lid 83 was etched to form a 0.4 mm long×1.8 mm wide×1 μm deep hole. The sections where the lid and lead electrodes 82 were in contact with each other were also etched about 1 μm deep so that the lid and the electrodes were separated. After cleaning the surfaces of substrate 81 and lid 83, they were directly bonded together. Since the gaps between lid 83 and lead electrodes 82 were filled with a glass having a low boiling point 85, IDT 84 on substrate 81 was sealed substantially in an airtight condition by lid 83.

EXAMPLE 9

In FIGS. 9(a), 9(b) and 9(c), 91 indicates a substrate; 92 is a lead electrode; 93 shows a lid; 94 is an IDT; and 95 indicates a silicon compound film. Substrate 91 is a ST-cut quartz plate 2.4 mm long×2.8 mm wide×500 μm thick. IDT 94, 0.1 mm long and 1.1 mm wide, was formed on the center of the substrate surface by forming a deposition film of chrome and gold on substrate 91. Ground and lead electrodes 92 were also formed around IDT 94 in a similar fashion. The area around IDT 94, and where lid 93 and substrate 91 were directly bonded together (shaded area in FIG. 9(b)) was formed with a 2 μm thick silicon oxide film. The surface of the film was abraded to form a flat silicon compound film 95 approximately 1 μm thick. Therefore, even if lid 93 was directly bonded to substrate 91, it was not in contact with IDT 94. A 1.4 mm long×2.8 mm wide×500 μm thick ST-cut quartz plate was used as lid 93. The ST-cut quartz plate used for lid 93 had the same coefficient of thermal expansion as the ST-cut quartz plate of substrate 91. Thus, the deterioration of resonance characteristics of the surface acoustic wave element due to the addition of thermal stress to substrate 91 after directly bonding the lid to the substrate was prevented. Substrate 91 and lid 93 were directly bonded together via silicon compound film 95. Thus, IDT 94 on substrate 91 was sealed substantially in an airtight condition by lid 93.

EXAMPLE 10

In FIGS. 10(a), 10(b) and 10(c), 101 indicates a substrate; 102 is a lead electrode; 103 shows a lid; 104 is an IDT; and 105 indicates a silicon compound film. Substrate 101 is a ST-cut quartz plate 2.4 mm long×2.8 mm wide×500 μm thick. IDT 104, 0.1 mm long and 1.1 mm wide, was formed on the center of the substrate surface by forming a deposition film of chrome and gold on substrate 101. Ground and lead electrodes 102 were also formed around IDT 104 in a similar fashion. The area around IDT 104, and where lid 103 and substrate 101 were directly bonded together (shaded area in FIG. 10(b)) was formed with a 2 μm thick silicon nitride film. The surface of the film was abraded to form a flat silicon compound film 105 approximately 1 μm thick. Therefore, even if lid 103 was directly bonded to substrate 101, it was not in contact with IDT 104. A 1.4 mm long×2.8 mm wide×500 μm thick ST-cut quartz plate was used as lid 103. The ST-cut quartz plate used for lid 103 had the same coefficient of thermal expansion as the ST-cut quartz plate of substrate 101. Thus, the deterioration of resonance characteristics of the surface acoustic wave element due to the addition of thermal stress to substrate 101 after directly bonding the lid to the substrate was prevented. Substrate 101 and lid 103 were directly bonded together via silicon compound film 105. Thus, IDT 104 on substrate 101 was sealed substantially in an airtight condition by lid 103.

EXAMPLE 11

In FIGS. 11(a), 11(b) and 11(c), 111 indicates a substrate; 112 is a lead electrode; 113 shows a lid; 114 is an IDT; and 115 indicates a silicon compound film. Substrate 111 is a Y-cut lithium niobate 2.4 mm long×2.8 mm wide×500 μm thick. IDT 114, 0.1 mm long and 1.1 mm wide, was formed on the center of the substrate surface by forming a deposition film of chrome and gold on substrate 111. Ground and lead electrodes 112 were also formed around IDT 114 in a similar fashion. The area around IDT 114, and where lid 113 and substrate 111 were directly bonded together (shaded area in FIG. 11(b)) was formed with a 2 μm thick silicon oxide film. The surface of the film was abraded to form a flat silicon compound film 115 approximately 1 μm thick. Therefore, even if lid 113 was directly bonded to substrate 111, it was not in contact with IDT 114. A 1.4 mm long×2.8 mm wide×500 μm thick Y-cut lithium niobate was used as lid 113. The Y-cut lithium niobate used for lid 113 had the same coefficient of thermal expansion as the Y-cut lithium niobate of substrate 111. Thus, the deterioration of resonance characteristics of the surface acoustic wave element due to the addition of thermal stress to substrate 111 after directly bonding the lid to the substrate was prevented. Substrate 111 and lid 113 were directly bonded together via silicon compound film 115. Thus, IDT 114 on substrate 111 was sealed substantially in an airtight condition by lid 113.

EXAMPLE 12

In FIGS. 12(a), 12(b) and 12(c), 121 indicates a substrate; 122 is a lead electrode; 123 shows a lid; 124 is an IDT; and 125 indicates a silicon compound film. Substrate 121 is a Y-cut lithium niobate 2.4 mm long×2.8 mm wide×500 μm thick. IDT 124, 0.1 mm long and 1.1 mm wide, was formed on the center of the substrate surface by forming a deposition film of chrome and gold on substrate 121. Ground and extended electrodes 122 were also formed around 124 in a similar fashion. The area around IDT 124, and where lid 123 and substrate 121 were directly bonded together (shaded area in FIG. 12(b)) was formed with a 2 μm thick silicon nitride film. The surface of the film was abraded to form a flat silicon compound film 125 approximately 1 μm thick. Therefore, even if lid 123 was directly bonded to substrate 121, it was not in contact with IDT 124. A 1.4 mm long×2.8 mm wide×500 μm thick Y-cut lithium niobate was used as lid 123. The Y-cut lithium niobate used for lid 123 had the same coefficient of thermal expansion as the Y-cut lithium niobate of substrate 121. Thus, the deterioration of resonance characteristics of the surface acoustic wave element due to the addition of thermal stress to substrate 121 after directly bonding the lid to the substrate was prevented. Substrate 121 and lid 123 were directly bonded together via silicon compound film 125. Thus, IDT 124 on substrate 121 was sealed substantially in an airtight condition by lid 123.

EXAMPLE 13

In FIGS. 13(a), 13(b) and 13(c), 131 indicates a substrate; 132 is a lead electrode; 133 shows a lid; 134 is an IDT; and 135 indicates a silicon compound film. Substrate 131 is a Y-cut lithium tantalete 2.4 mm long×2.8 mm wide×500 μm thick. IDT 134, 0.1 mm long and 1.1 mm wide, was formed on the center of the substrate surface by forming a deposition film of chrome and gold on substrate 131. Ground and lead electrodes 132 were also formed around IDT 134 in a similar fashion. The area around IDT 134, and where lid 133 and substrate 131 were directly bonded together (shaded area in FIG. 13(b)) was formed with a 2 μm thick silicon oxide film. The surface of the film was abraded to form a flat silicon compound film 135 approximately 1 μm thick. Therefore, even if lid 133 was directly bonded to substrate 131, it was not in contact with IDT 134. A 1.4 mm long×2.8 mm wide×500 μm thick Y-cut lithium tantalete was used as lid 133. The Y-cut lithium tantalete used for lid 133 had the same coefficient of thermal expansion as the Y-cut lithium tantalete of substrate 131. Thus, the deterioration of resonance characteristics of the surface acoustic wave element due to the addition of thermal stress to substrate 131 after directly bonding the lid to the substrate was prevented. Substrate 131 and lid 133 were directly bonded together via silicon compound film 135. Thus, IDT 134 on substrate 131 was substantially sealed in an airtight condition by lid 133.

EXAMPLE 14

In FIGS. 14(a), 14(b) and 14(c), 141 indicates a substrate; 142 is a lead electrode; 143 shows a lid; 144 is an IDT; and 145 indicates a silicon compound film. Substrate 141 is a Y-cut lithium tantalete 2.4 mm long×2.8 mm wide×500 μm thick. IDT 144, 0.1 mm long and 1.1 mm wide, was formed on the center of the substrate surface by forming a deposition film of chrome and gold on substrate 141. Ground and lead electrodes 142 were also formed around lead electrodes 144 in a similar fashion. The area around IDT 144, and where lid 143 and substrate 141 were directly bonded together (shaded area in FIG. 14(b)) was formed with a 2 μm thick silicon nitride film. The surface of the film was abraded to form a flat silicon compound film 145 approximately 1 μm thick. Therefore, even if lid 143 was directly bonded to substrate 141, it was not in contact with IDT 144. A 1.4 mm long×2.8 mm wide×500 μm thick Y-cut lithium tantalete was used as lid 143. The Y-cut lithium tantalete used for lid 143 had the same coefficient of thermal expansion as the Y-cut lithium tantalete of substrate 141. Thus, the deterioration of resonance characteristics of the surface acoustic wave element due to the addition of thermal stress to substrate 141 after directly bonding the lid to the substrate was prevented. Substrate 141 and lid 143 were directly bonded together via silicon compound film 145. Thus, IDT 144 on substrate 141 was substantially sealed in an airtight condition by lid 143.

EXAMPLE 15

In FIGS. 15(a), 15(b) and 15(c), 151 indicates a substrate; 152 is a lead electrode; 153 shows a lid; 154 is an IDT; and 155 indicates a silicon compound film. Substrate 151 is a Y-cut lithium niobate 2.4 mm long×2.8 mm wide×500 μm thick. IDT 154, 0.1 mm long and 1.1 mm wide, was formed on the center of the substrate surface by forming a deposition film of chrome and gold on substrate 151. Ground and lead electrodes 152 were also formed around IDT 154 in a similar fashion. The area around IDT 154, and where lid 153 and substrate 151 were directly bonded together (shaded area in FIG. 15(b)) was formed with a 2 μm thick silicon oxide film. The surface of the film was abraded to form a flat silicon compound film 155 approximately 1 μm thick. Therefore, even if lid 153 was directly bonded to substrate 151, it was not in contact with IDT 154. A 1.4 mm long×2.8 mm wide×500 μm thick ST-cut quartz plate was used as lid 153. The ST-cut quartz plate used for lid 153 had the same coefficient of thermal expansion as the Y-cut lithium niobate of substrate 151. Thus, the deterioration of resonance characteristics of the surface acoustic wave element due to the addition of thermal stress to substrate 151 after directly bonding the lid to the substrate was prevented. Substrate 151 and lid 153 were directly bonded together via silicon compound film 155. Thus, IDT 154 on substrate 151 was substantially sealed in an airtight condition by lid 153.

EXAMPLE 16

In FIGS. 16(a), 16(b) and 16(c), 161 indicates a substrate; 162 is a lead electrode; 163 shows a lid; 164 is an IDT; and 165 indicates a silicon compound film. Substrate 161 is a Y-cut lithium niobate 2.4 mm long×2.8 mm wide×500 μm thick. IDT 164, 0.1 mm long and 1.1 mm wide, was formed on the center of the substrate surface by forming a deposition film of chrome and gold on substrate 161. Ground and extended electrode 162 were also formed around IDT 164 in a similar fashion. The area around IDT 164, and where lid 163 and substrate 161 were directly bonded together (shaded area in FIG. 16(b)) was formed with a 2 μm thick silicon nitride film. The surface of the film was abraded to form a flat silicon compound film 165 approximately 1 μm thick. Therefore, even if lid 163 was directly bonded to substrate 161, it was not in contact with IDT 164. A 1.4 mm long×2.8 mm wide×500 μm thick ST-cut quartz plate was used as lid 163. The ST-cut quartz plate used for lid 163 had the same coefficient of thermal expansion as the Y-cut lithium niobate of substrate 161. Thus, the deterioration of resonance characteristics of the surface acoustic wave element due to the addition of thermal stress to substrate 161 after directly bonding the lid to the substrate was prevented. Substrate 161 and lid 163 were directly bonded together via silicon compound film 165. Thus, IDT 164 on substrate 161 was substantially sealed in an airtight condition by lid 163.

EXAMPLE 17

In FIGS. 17(a), 17(b) and 17(c), 171 indicates a substrate; 172 is a lead electrode; 173 shows a lid; 174 is an IDT; and 175 indicates a silicon compound film. Substrate 171 is a Y-cut lithium tantalete 2.4 mm long×2.8 mm wide×500 μm thick. IDT 174, 0.1 mm long and 1.1 mm wide, was formed on the center of the substrate surface by forming a deposition film of chrome and gold on substrate 171. Ground and lead electrodes 172 were also formed around IDT 174 in a similar fashion. The area around IDT, and where lid 173 and substrate 171 were directly bonded together (shaded area in FIG. 17(b)) was formed with a 2 μm thick silicon oxide film. The surface of the film was abraded to form a flat silicon compound film 175 approximately 1 μm thick. Therefore, even if lid 173 was directly bonded to substrate 171, it was not in contact with IDT 174. A 1.4 mm long×2.8 mm wide×500 µm thick ST-cut quartz plate was used as lid 173. The ST-cut quartz plate used for lid 173 had the same coefficient of thermal expansion as the Y-cut lithium tantalete of substrate 171. Thus, the deterioration of resonance characteristics of the surface acoustic wave element due to the addition of thermal stress to substrate 171 after directly bonding the lid to the substrate was prevented. Substrate 171 and lid 173 were directly bonded together via silicon compound film 175. Thus, IDT 174 on substrate 171 was substantially sealed in an airtight condition by lid 173.

EXAMPLE 18

Figure 18:
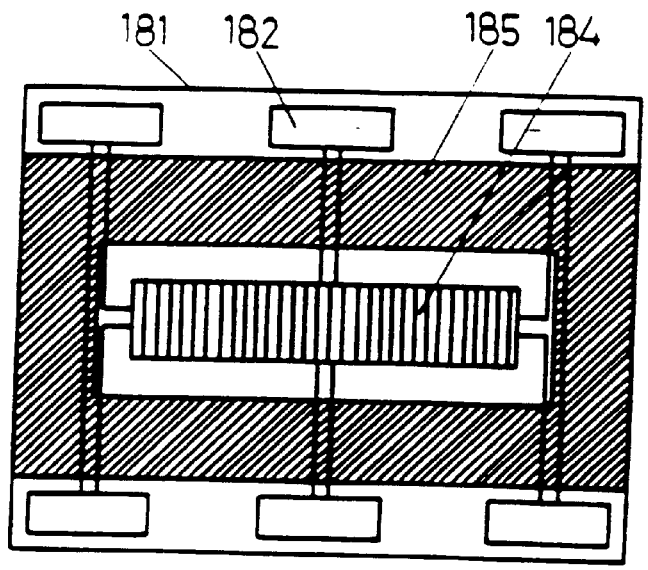
FIG. 18(a) shows a horizontal sectional view of a substrate having a surface acoustic wave element of another embodiment of the invention.
FIG. 18(b) shows a cross sectional view of the surface acoustic wave device comprising the surface acoustic wave element of the embodiment of FIG. 18(a).
FIG. 18(c) shows a perspective view of the surface acoustic wave device of the embodiment of FIG. 18(a).
Figure 18:
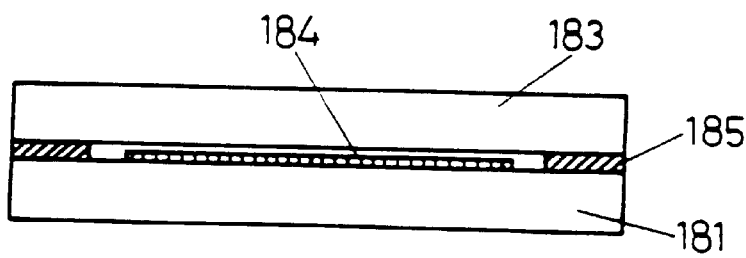
Figure 18:
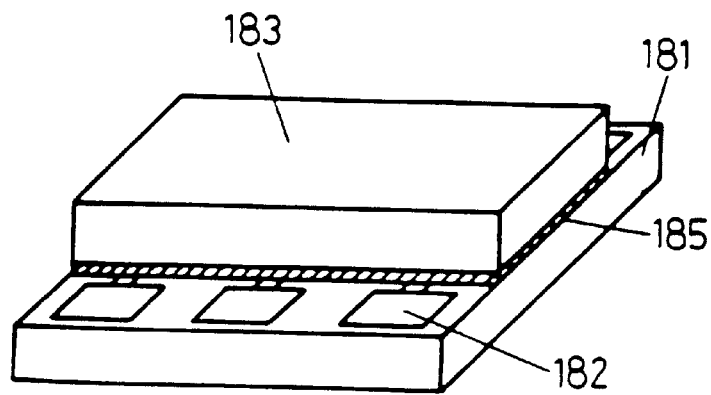

In FIGS. 18(*a*), 18(*b*) and 18(*c*), 181 indicates a substrate; 182 is a lead electrode; 183 shows a lid; 184 is an IDT; and 185 indicates a silicon compound film. Substrate 181 is a Y-cut lithium tantalete 2.4 mm long×2.8 mm wide×500 µm thick. IDT 184, 0.1 mm long and 1.1 mm wide, was formed on the center of the substrate surface by forming a deposition film of chrome and gold on substrate 181. Ground and lead electrodes 182 were also formed around IDT 184 in a similar fashion. The area around IDT 184, and where lid 183 and substrate 181 were directly bonded together (shaded area in FIG. 18(*b*)) was formed with a 2 µm thick silicon nitride film. The surface of the film was abraded to form a flat silicon compound film 185 approximately 1 µm thick. Therefore, even if lid 183 was directly bonded to substrate 181, it was not in contact with IDT 184. A 1.4 mm long×2.8 mm wide×500 µm thick ST-cut quartz plate was used as lid 183. The ST-cut quartz plate used for lid 183 had the same coefficient of thermal expansion as the Y-cut lithium tantalete of substrate 181. Thus, the deterioration of resonance characteristics of the surface acoustic wave element due to the addition of thermal stress to substrate 181 after directly bonding the lid to the substrate was prevented. Substrate 181 and lid 183 were directly bonded together via silicon compound film 185. Thus, IDT 184 on substrate 181 was substantially sealed in an airtight condition by lid 183.

EXAMPLE 19

Figure 19A:
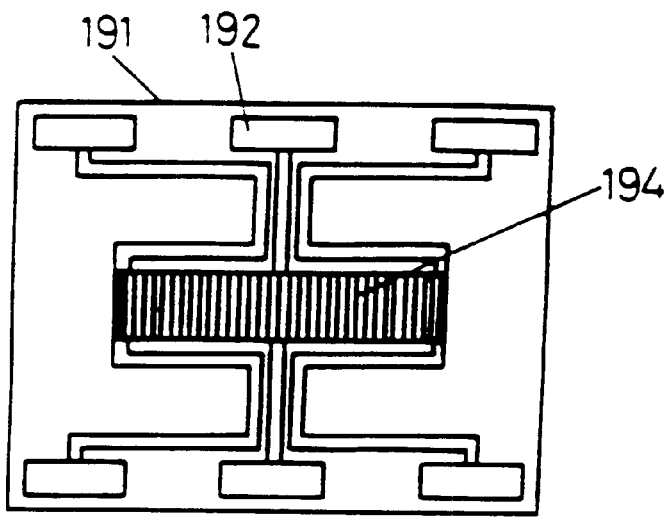
FIG. 19(a) shows a horizontal sectional view of a substrate having a surface acoustic wave element of another embodiment of the invention.
Figure 19B:
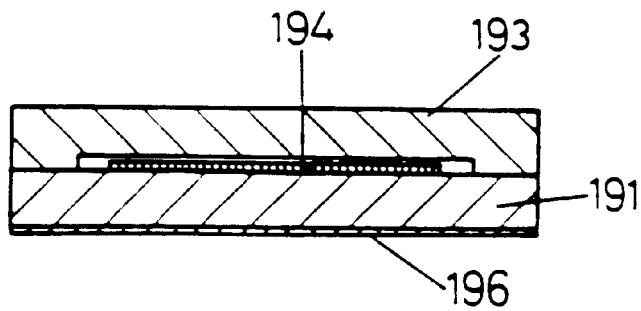
FIG. 19(b) shows a cross sectional view of the surface acoustic wave device comprising the surface acoustic wave element of the embodiment of FIG. 19(a).
Figure 19C:
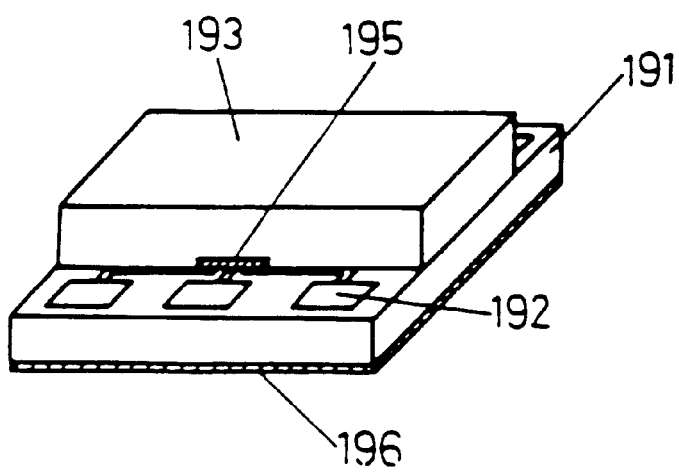
FIG. 19(c) shows a perspective view of the surface acoustic wave device of the embodiment of FIG. 19(a).

In FIGS. 19(*a*), 19(*b*) and 19(*c*), 191 indicates a substrate; 192 is a lead electrode; 193 shows a lid; 194 is an IDT; 195 indicates a glass having a low melting point; and 196 is a metal film (shield). Substrate 191 is a ST-cut quartz plate 2.4 mm long×2.8 mm wide×500 µm thick. IDT 194, 0.1 mm long and 1.1 mm wide, was formed on the center of the substrate surface by forming a deposition film of chrome and gold on substrate 191. Ground and lead electrodes 192 were also formed around IDT 194 in a similar fashion. A 1.4 mm long×2.8 mm wide×500 µm thick ST-cut quartz plate was used as lid 193. The ST-cut quartz plate used for lid 193 had the same coefficient of thermal expansion as the ST-cut quartz plate of substrate 191. Thus, the deterioration of resonance characteristics of the surface acoustic wave element due to the addition of thermal stress to substrate 191 after directly bonding the lid to the substrate was prevented. In addition, the center of lid 193 was etched to form a 0.4 mm long×1.8 mm wide×1 µm deep hole. The sections where the lid and lead electrodes 192 were in contact with each other were also etched about 1 µm deep so that the lid and the electrode were separated. On the entire back surface of substrate 191, a deposition film of chrome and gold was formed, thus forming metal film 196 to reduce noise. After cleaning the surfaces of substrate 191 and lid 193, they were directly bonded together. Since the gaps between lid 193 and lead electrodes 192 was filled with a glass having a low boiling point 195, IDT 194 on substrate 191 was substantially sealed by lid 193.

EXAMPLE 20

Figure 20:
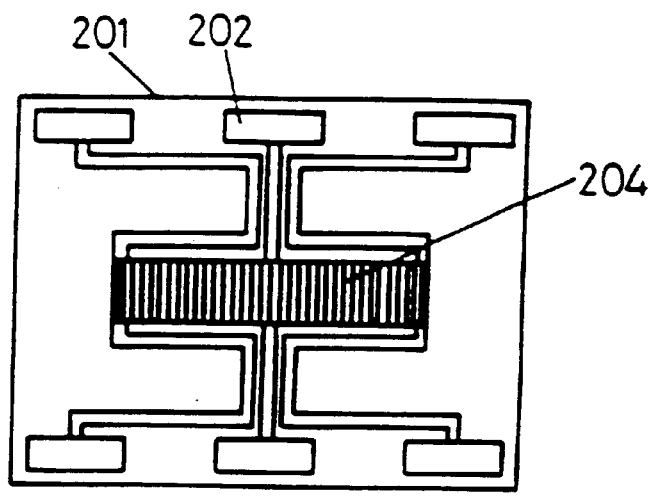
FIG. 20(a) shows a horizontal sectional view of a substrate having a surface acoustic wave element of another embodiment of the invention.
FIG. 20(b) shows a cross sectional view of the surface acoustic wave device comprising the surface acoustic wave element of the embodiment of FIG. 20(a).
FIG. 20(c) shows a perspective view of the surface acoustic wave device of the embodiment of FIG. 20(a).
Figure 20:
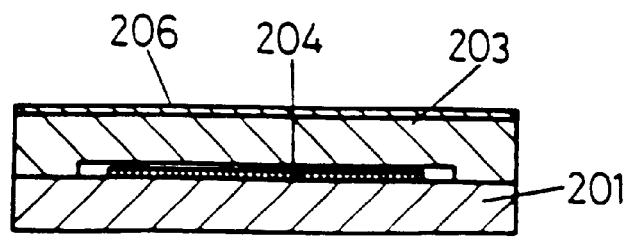
Figure 20:
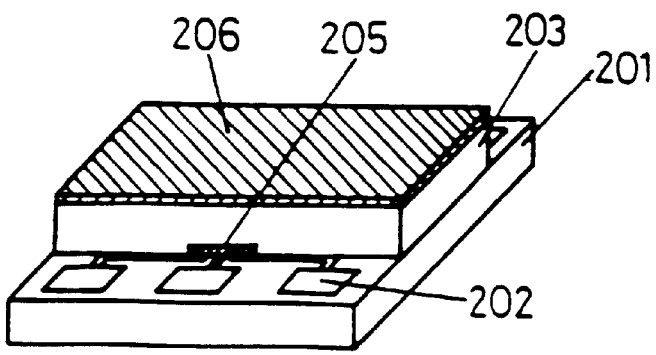

In FIGS. 20(*a*), 20(*b*) and 20(*c*), 201 indicates a substrate; 202 is a lead electrode; 203 shows a lid; 204 is an IDT; 205 indicates a glass having a low melting point; and 206 is a metal film (shield). Substrate 201 is a ST-cut quartz plate 2.4 mm long×2.8 mm wide×500 µm thick. IDT 204, 0.1 mm long and 1.1 mm wide, was formed on the center of the substrate surface by forming a deposition film of chrome and gold on substrate 201. Ground and lead electrodes 202 were also formed around IDT 204 in a similar fashion. A 1.4 mm long×2.8 mm wide×500 µm thick ST-cut quartz plate was used as lid 203. The ST-cut quartz plate used for lid 203 had the same coefficient of thermal expansion as the ST-cut quartz plate of substrate 201. Thus, the deterioration of resonance characteristics of the surface acoustic wave element due to the addition of thermal stress to substrate 201 after directly bonding the lid to the substrate was prevented. On the entire top surface of lid 203, a deposition film of chrome and gold was formed, thus forming metal film 206 to reduce noise. In addition, the center of lid 203 was etched to form a 0.4 mm long×1.8 mm wide×1 µm deep hole. The sections where the lid and lead electrodes 202 were in contact with each other were also etched about 1 µm deep so that the lid and the electrodes were separated. After cleaning the surfaces of substrate 201 and lid 203, they were directly bonded together. Since the gaps between lid 203 and lead electrodes 202 were filled with a glass having a low boiling point 205, IDT 204 on substrate 201 was substantially sealed by lid 203.

EXAMPLE 21

Figure 21A:
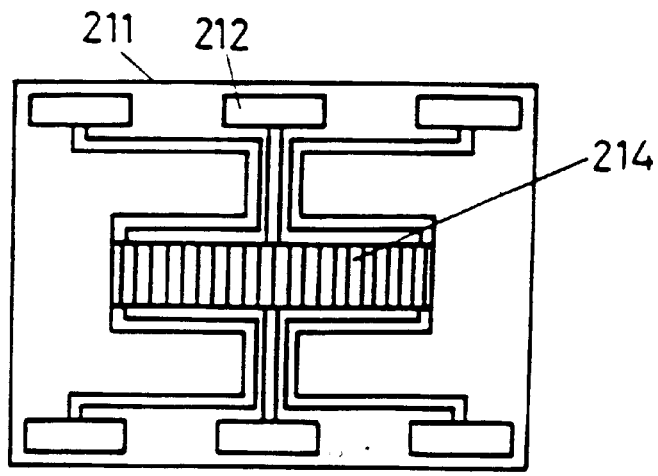
FIG. 21(a) shows a horizontal sectional view of a substrate having a surface acoustic wave element of another embodiment of the invention.
Figure 21B:
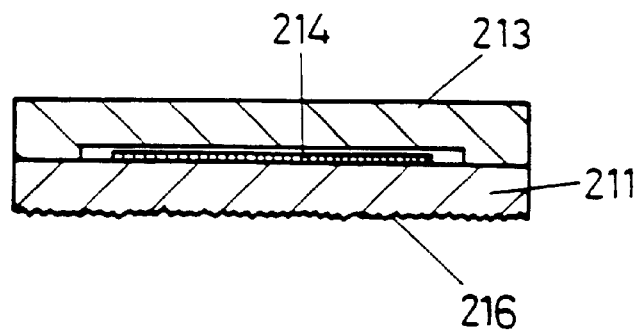
FIG. 21(b) shows a cross sectional view of the surface acoustic wave device comprising the surface acoustic wave element of the embodiment of FIG. 21(a).
Figure 21C:
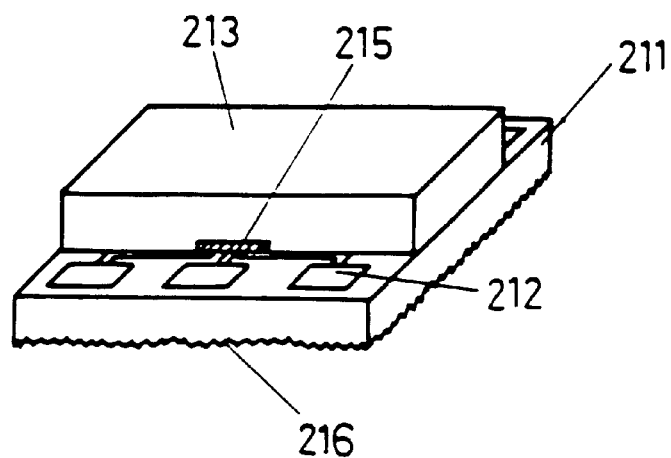
FIG. 21(c) shows a perspective view of the surface acoustic wave device of the embodiment of FIG. 21(a).
Figure 22:
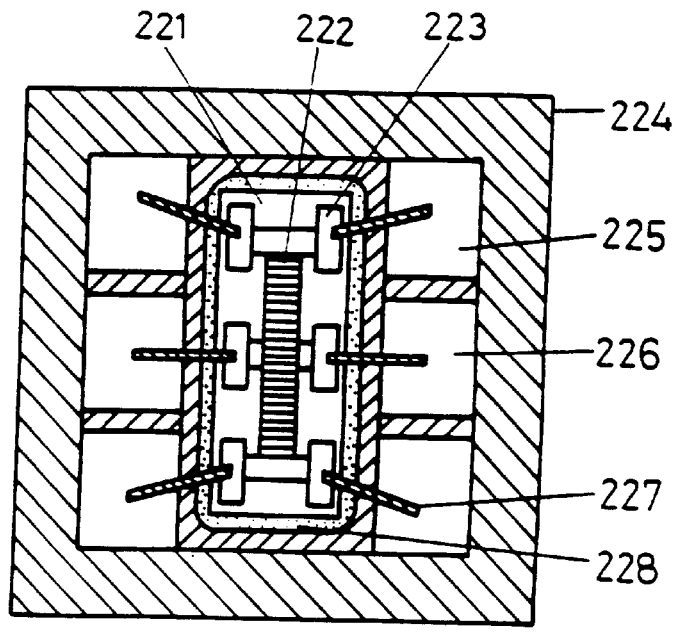
FIG. 22(a) shows a horizontal sectional view of a substrate having a conventional surface acoustic wave element.
FIG. 22(b) shows a cross sectional view of the surface acoustic wave device comprising the surface acoustic wave element of the embodiment of FIG. 22(a).
FIG. 22(c) shows a perspective view of the surface acoustic wave device of the embodiment of FIG. 22(a).
Figure 22:
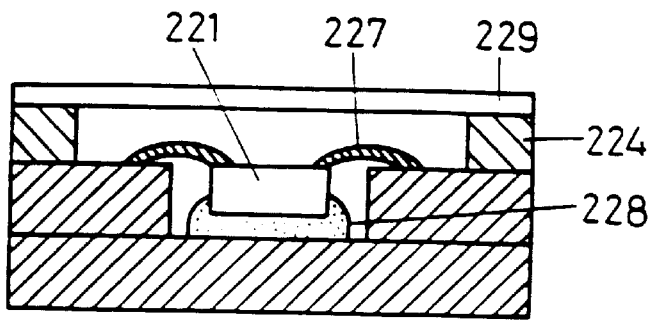
Figure 22:
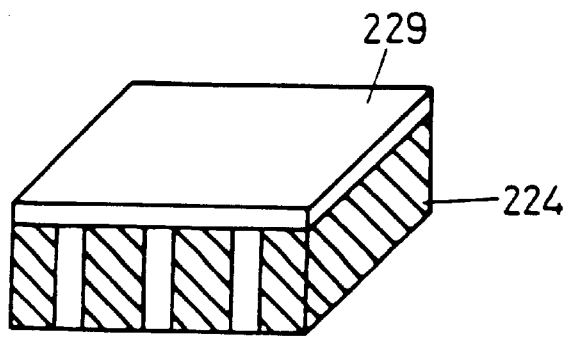

In FIGS. 21(*a*), 21(*b*) and 21(*c*), 211 indicates a substrate; 212 is a lead electrode; 213 shows a lid; 214 is an IDT; 215 indicates a glass having a low melting point; and 216 is a roughened back surface of the substrate. Substrate 211 is a ST-cut quartz plate 2.4 mm long×2.8 mm wide×500 µm thick. IDT 214, 0.1 mm long and 1.1 mm wide, was formed on the center of the substrate surface by forming a deposition film of chrome and gold on substrate 211. Ground and lead electrodes 212 were also formed around IDT 214 in a similar fashion. When a surface acoustic wave generated at the front surface of substrate 211 is reflected on the back surface of substrate 211, the properties of the surface acoustic wave are lowered. Thus, the back surface was roughened to reflect the surface acoustic wave irregularly. A 1.4 mm long×2.8 mm wide×500 µm thick ST-cut quartz plate was used as lid 213. The ST-cut quartz plate used for lid 213 had the same coefficient of thermal expansion as the ST-cut quartz plate of substrate 211. Thus, the deterioration of resonance characteristics of the surface acoustic wave element due to the addition of thermal stress to substrate 211 after directly bonding the lid to the substrate was prevented. In addition, the center of lid 213 was etched to form a 0.4 mm long×1.8 mm wide×1 µm deep hole. The sections where the lid and lead electrodes 212 were in contact with each other were also etched about 1 µm deep so that the lid and the electrodes were separated. After cleaning the surfaces of substrate 211 and lid 213, they were directly bonded together. Since the gaps between lid 213 and lead electrode 212 were filled with a glass having a low boiling point 215, IDT 214 on substrate 211 was substantially sealed by lid 213.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

We claim:

1. A surface acoustic wave device comprising:
   a substrate having a surface acoustic wave element with at least one lead electrode, said substrate having a front side and a back side; and
   a lid, said lid having an upper surface and a lower surface, wherein
   (i) said substrate and said lid are covalently bonded to each other via a common oxygen atom, thereby sealing said element therebetween;
   (ii) said lid and said substrate have substantially the same coefficient of thermal expansion; and
   (iii) said lid having a means defining at least one gap located above the at least one lead electrode, wherein said gap contains silicon or a silicon containing compound.

2. A surface acoustic wave device as claimed in claim 1, wherein said substrate is at least one material selected from the group consisting of quartz, lithium niobate, lithium tantalete and lithium borate.

3. A surface acoustic wave device as claimed in claim 1, wherein said silicon compound is silicon oxide or silicon nitride.

4. A surface acoustic wave device as claimed in claim 1, wherein a metal film is formed on a surface of a surface of said lid and said back side of said substrate.

5. A surface acoustic wave device as claimed in claim 1, wherein said lid is made of at least one material selected from the group consisting of quartz, glass, lithium niobate, lithium tantalete, and lithium borate.

6. A surface acoustic wave device as claimed in claim 1, wherein said silicon containing compound is a low melting point glass.

7. A surface acoustic wave device as claimed in claim 1, wherein said back side of said substrate has a roughened surface.

* * * * *